(12) United States Patent
Lee et al.

(10) Patent No.: US 12,087,686 B2
(45) Date of Patent: Sep. 10, 2024

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventors: Jin Won Lee, Seoul (KR); Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/320,818

(22) Filed: May 19, 2023

(65) Prior Publication Data

US 2023/0298992 A1   Sep. 21, 2023

Related U.S. Application Data

(63) Continuation of application No. 17/500,685, filed on Oct. 13, 2021, now Pat. No. 11,688,682, which is a
(Continued)

(30) Foreign Application Priority Data

Jul. 24, 2019   (KR) ........................ 10-2019-0089869

(51) Int. Cl.
| | |
|---|---|
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |

(Continued)

(52) U.S. Cl.
CPC ...... *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
USPC .................................. 257/314, 324
See application file for complete search history.

(56) References Cited

U.S. PATENT DOCUMENTS

| | | | |
|---|---|---|---|
| 11,545,388 B2 * | 1/2023 | Zhou | H01L 21/31144 |
| 11,690,234 B2 * | 6/2023 | Zhao | H01L 21/76822 |
| | | | 438/275 |

(Continued)

FOREIGN PATENT DOCUMENTS

| | | |
|---|---|---|
| CN | 107039457 A | 8/2017 |
| CN | 107546229 A | 1/2018 |

(Continued)

*Primary Examiner* — Bo B Jang
(74) *Attorney, Agent, or Firm* — WILLIAM PARK & ASSOCIATES LTD.

(57) ABSTRACT

There are provided a semiconductor memory device and a manufacturing method of the semiconductor memory device. A semiconductor memory device includes a lower stack structure on the substrate and including a plurality of lower layers stacked in a vertical direction, an intermediate stack structure on the lower stack structure and including a plurality of intermediate layers stacked in the vertical direction, a plurality of grooves in the contact region and penetrating the intermediate stack structure, the plurality of grooves exposing the lower stack structure at different depths, and a plurality of steps formed along sidewalls of the grooves.

20 Claims, 23 Drawing Sheets

Related U.S. Application Data continuation of application No. 16/690,721, filed on Nov. 21, 2019, now Pat. No. 11,177,209.

(51) Int. Cl.
  *H10B 43/10*     (2023.01)
  *H10B 43/27*     (2023.01)
  *H10B 43/35*     (2023.01)

(56)            References Cited

U.S. PATENT DOCUMENTS

| | | |
|---|---|---|
| 2013/0161821 A1 | 6/2013 | Hwang et al. |
| 2017/0033117 A1 | 2/2017 | Lee |
| 2017/0141032 A1 | 5/2017 | Lee |
| 2017/0200676 A1 | 7/2017 | Jeong et al. |
| 2017/0256551 A1 | 9/2017 | Lee |
| 2017/0263556 A1 | 9/2017 | Tessariol et al. |
| 2017/0373088 A1 | 12/2017 | Lee |

FOREIGN PATENT DOCUMENTS

| | | |
|---|---|---|
| CN | 111696988 A | 9/2020 |
| KR | 1020130072522 A | 7/2013 |
| KR | 1020170014757 A | 2/2017 |
| KR | 1020180001301 A | 1/2018 |
| KR | 1020190085475 A | 7/2019 |

\* cited by examiner

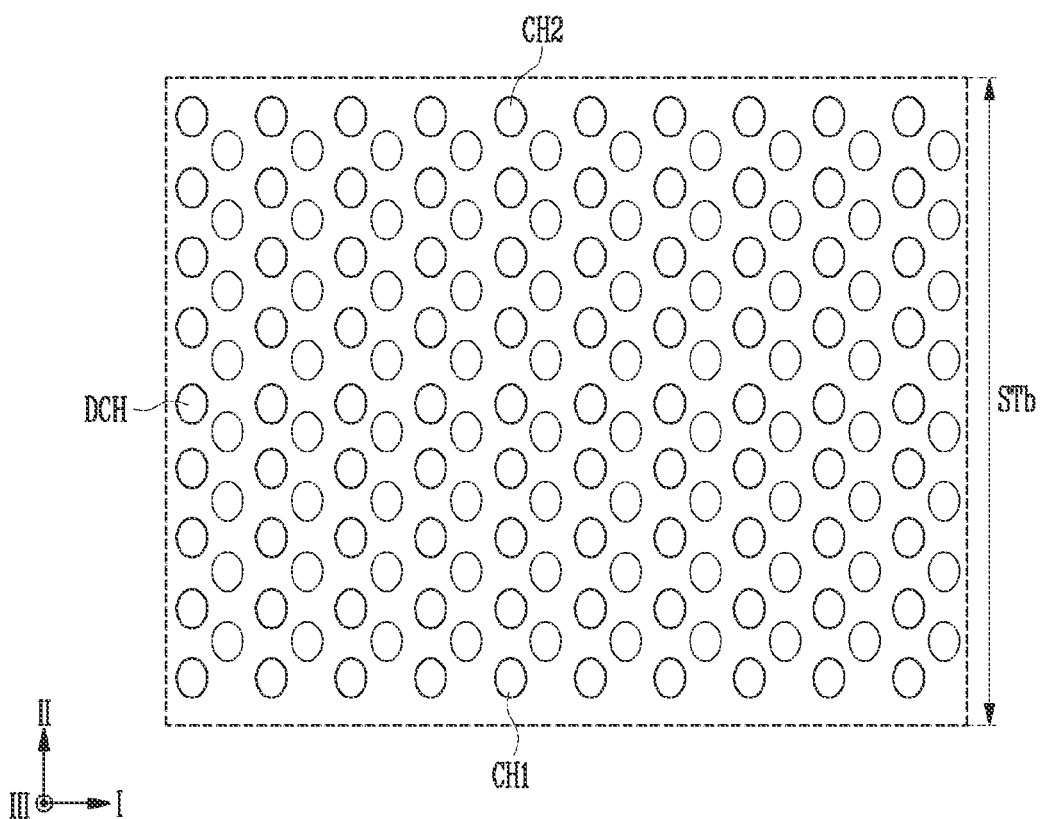

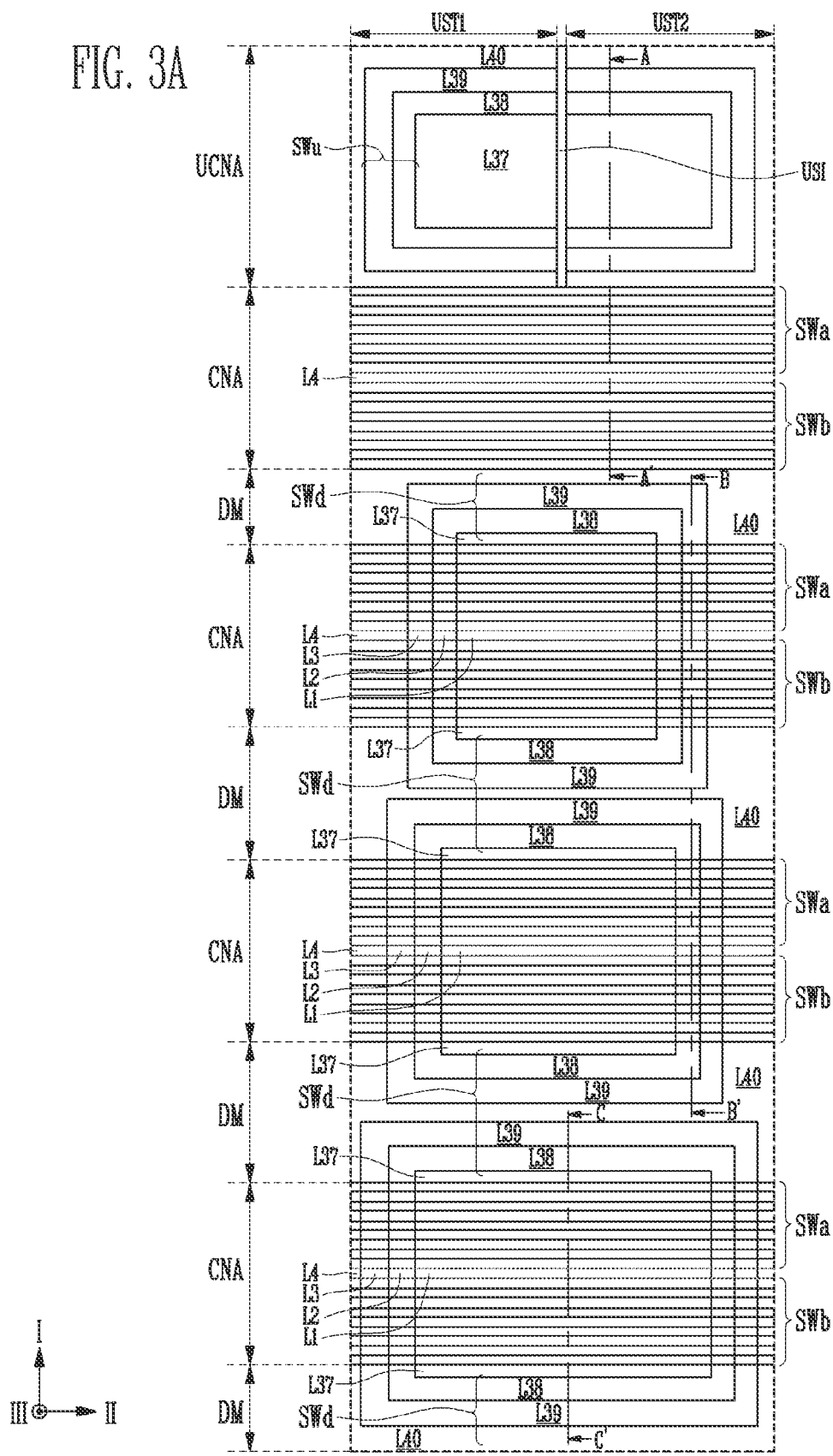

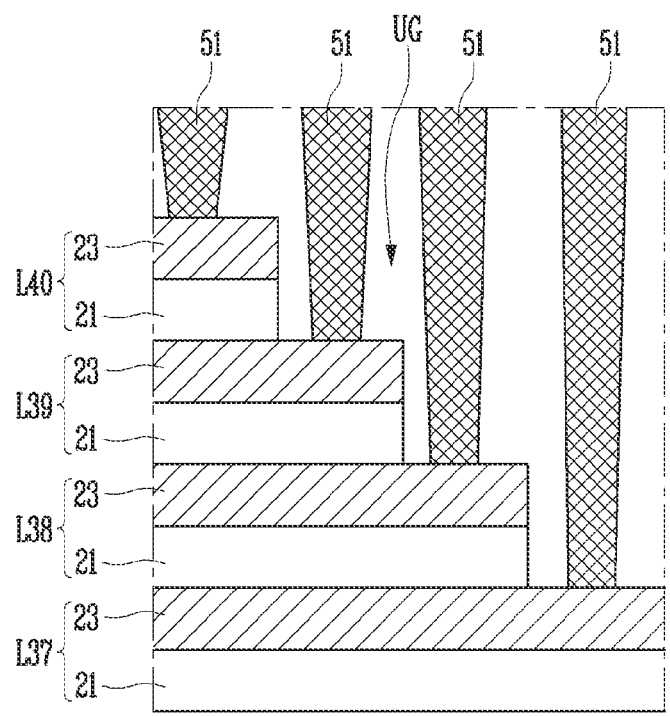

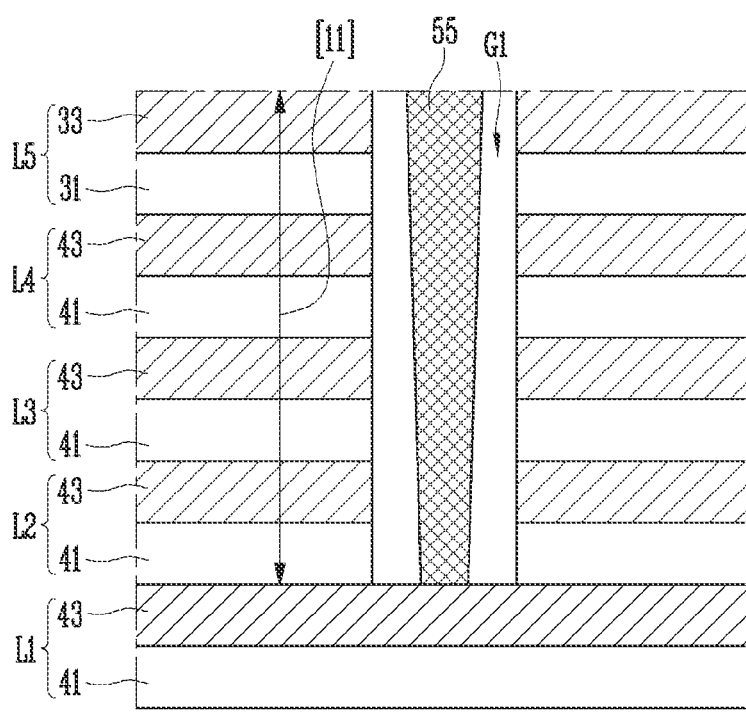

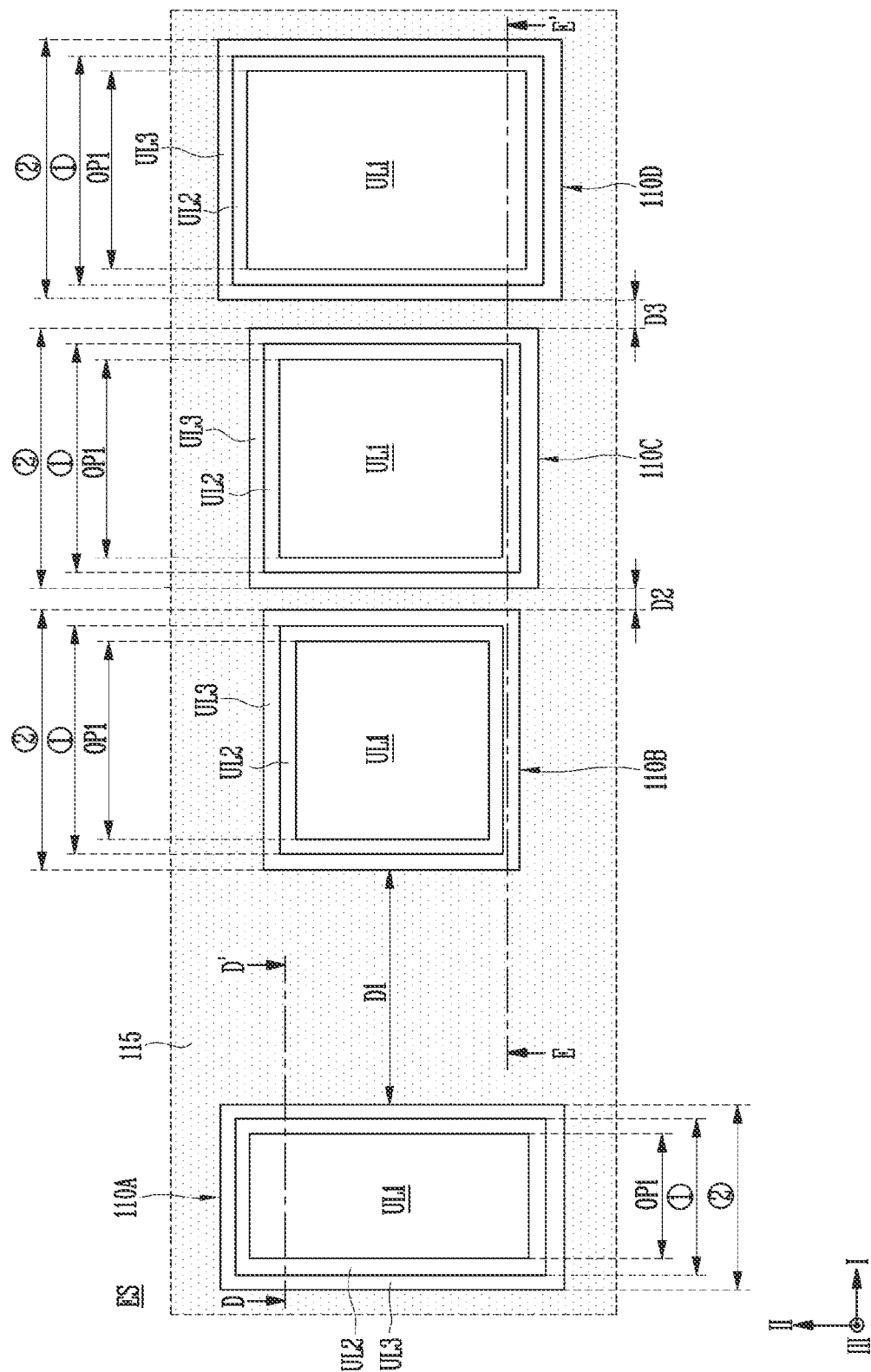

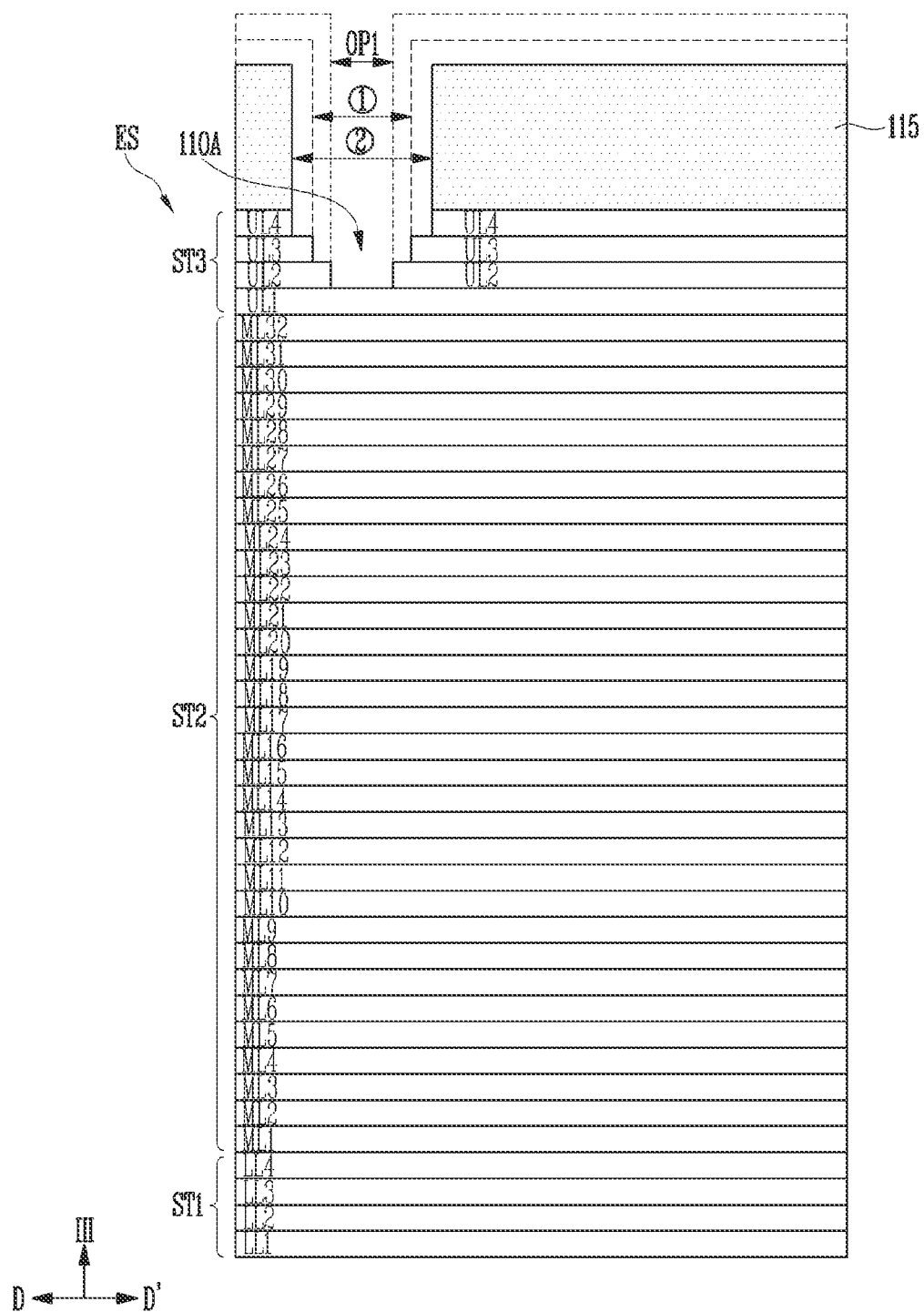

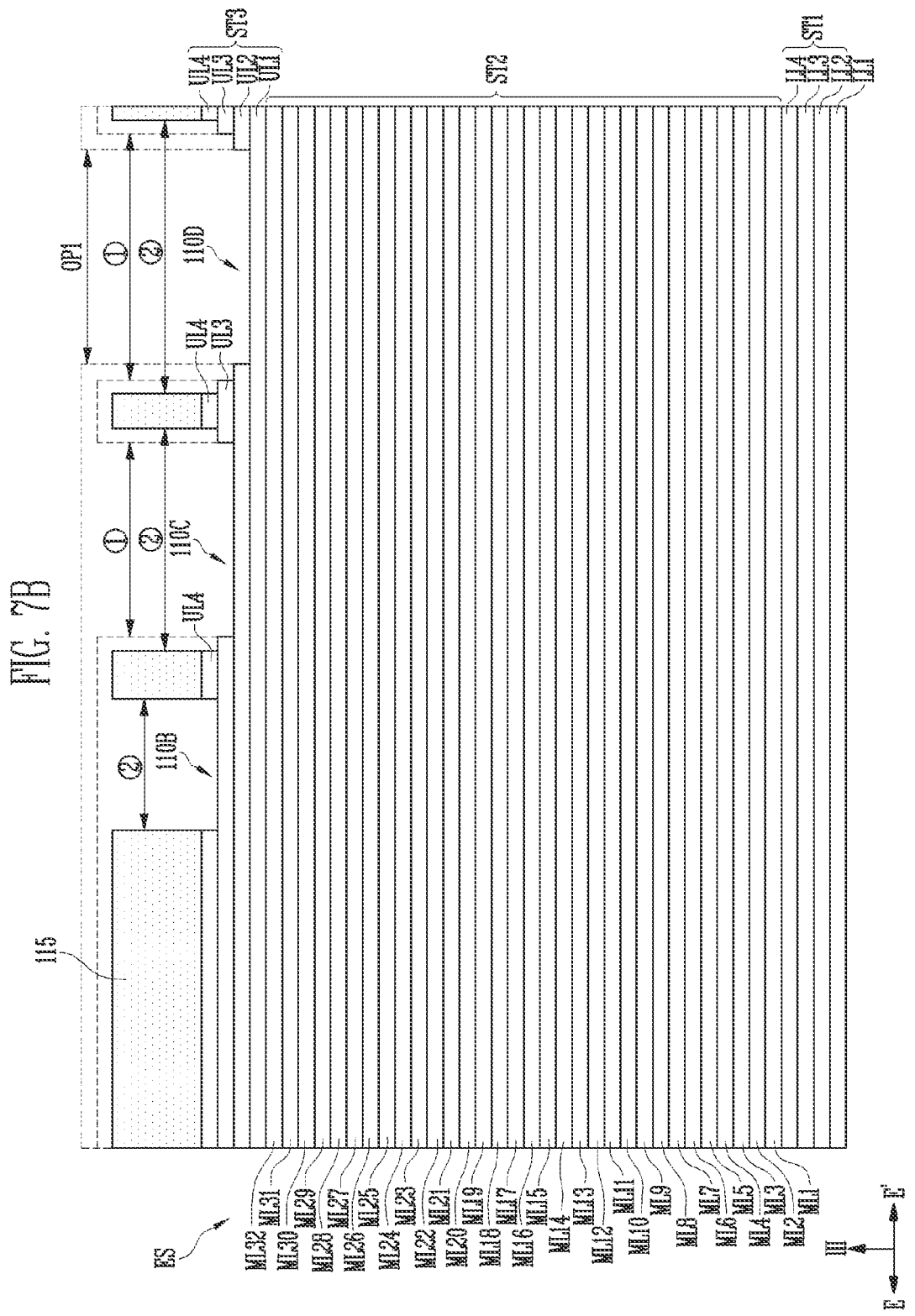

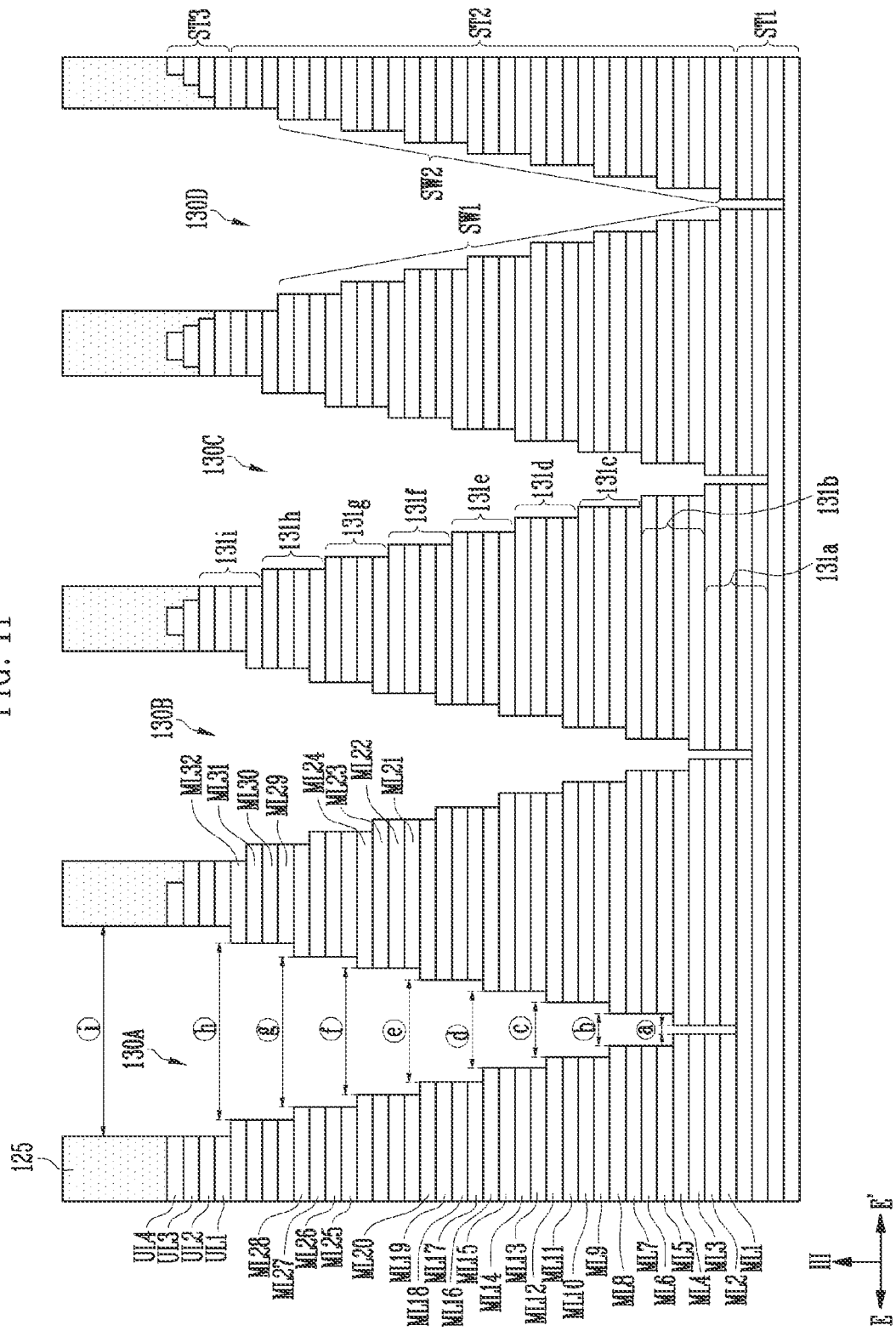

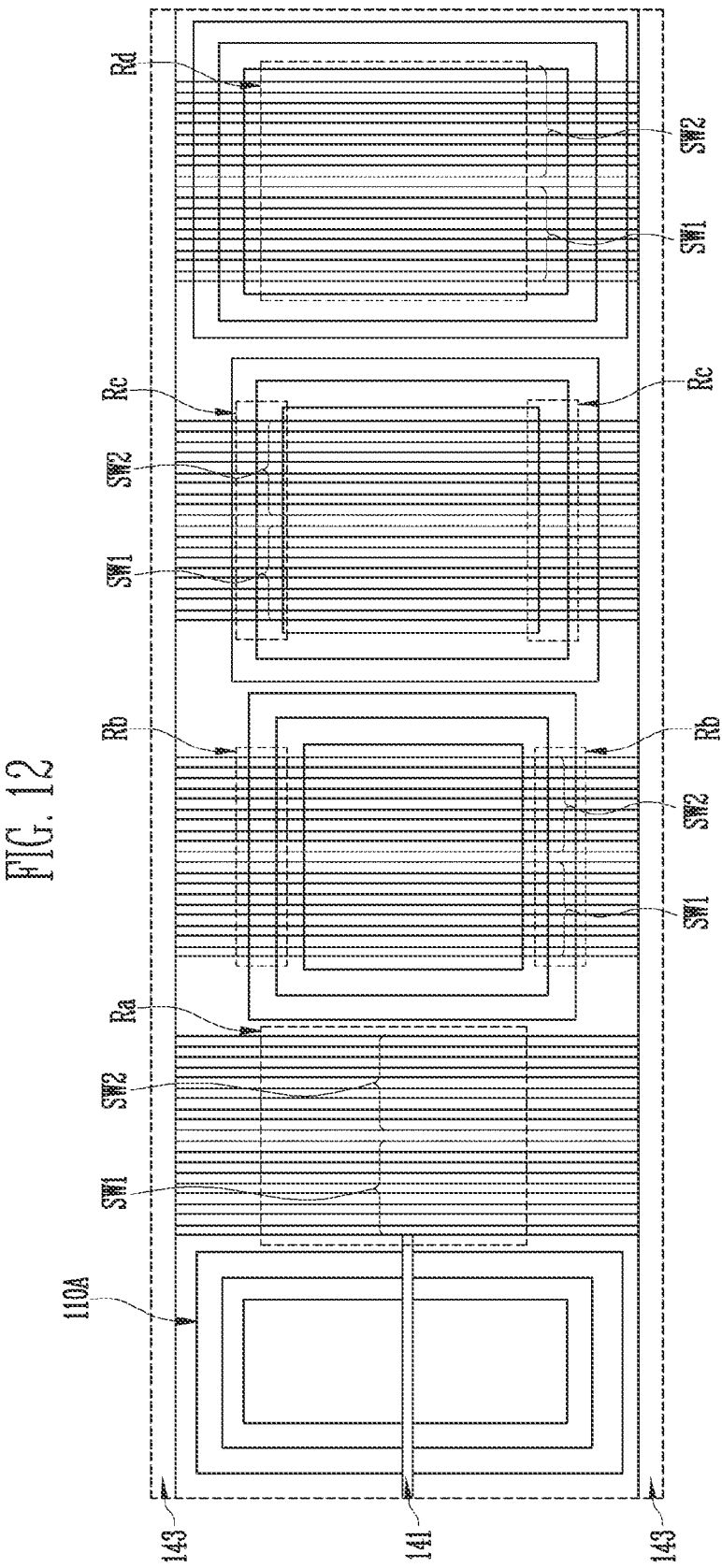

SEMICONDUCTOR MEMORY DEVICE AND MANUFACTURING METHOD OF THE SEMICONDUCTOR MEMORY DEVICE

CROSS-REFERENCE TO RELATED APPLICATION

The present application is a continuation application of U.S. patent application Ser. No. 17/500,685, filed on Oct. 13, 2021, which is a continuation application of U.S. patent application Ser. No. 16/690,721, filed on Nov. 21, 2019, and claims priority under 35 U.S.C. § 119(a) to Korean patent application number 10-2019-0089869, filed on Jul. 24, 2019, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device may include a memory cell array including a plurality of memory cells. The memory cell array may include memory cells arranged in various structures. In order to improve the degree of integration of semiconductor memory devices, a three-dimensional semiconductor memory device has been proposed.

The three-dimensional semiconductor memory device includes three-dimensionally arranged memory cells. The three-dimensional semiconductor memory device may include a plurality of layers stacked in a vertical direction. A stack structure including the plurality of layers may include connection regions connected to contact plugs to receive an electrical signal.

SUMMARY

In accordance with an aspect of the present disclosure, there may be provided a semiconductor memory device including: a substrate including a cell region and a contact region; a lower stack structure on the substrate and including a plurality of lower layers stacked in a vertical direction; an intermediate stack structure on the lower stack structure and including a plurality of intermediate layers stacked in the vertical direction; a plurality of grooves in the contact region and penetrating the intermediate stack structure, the plurality of grooves exposing the lower stack structure at different depths; and a plurality of steps formed along sidewalls of the grooves.

In accordance with another aspect of the present disclosure, there may be provided a method of manufacturing a semiconductor memory device, the method including: forming a first stack structure including a plurality of lower layers stacked in a vertical direction; forming a second stack structure including a plurality of intermediate layers stacked in the vertical direction on the first stack structure; forming a third stack structure including a plurality of upper layers stacked in the vertical direction on the second stack structure; etching the third stack structure such that reference regions respectively exposing upper surfaces of the upper layers are defined; forming a mask pattern including openings opening the reference regions on the third stack structure; and forming a plurality of grooves respectively opening upper surfaces of the lower layers by using the mask pattern as an etch barrier.

BRIEF DESCRIPTION OF THE DRAWINGS

FIGS. 2A and 2B are plan views schematically illustrating a portion of each gate stack structure overlapping with a cell region shown in FIG. 1.

FIGS. 3A and 3B are plan views illustrating various embodiments of a portion of each gate stack structure overlapping with a contact region shown in FIG. 1.

FIGS. 5A to 5C are sectional views illustrating contact plugs formed in connection regions in accordance with an embodiment of the present disclosure.

FIGS. 6, 7A and 7B, 8, 9, 10A and 10B, 11, and 12 are views illustrating a manufacturing method of a semiconductor memory device in accordance with an embodiment of the present disclosure.

DETAILED DESCRIPTION

The specific structural or functional description disclosed herein is merely illustrative for the purpose of describing embodiments according to the concepts of the present disclosure. The embodiments according to the concepts of the present disclosure can be implemented in various forms, and cannot be construed as limited to the embodiments set forth herein.

Embodiments may provide a semiconductor memory device capable of simplifying a manufacturing process for forming a connection region and a manufacturing method of the semiconductor memory device.

Figure 1:
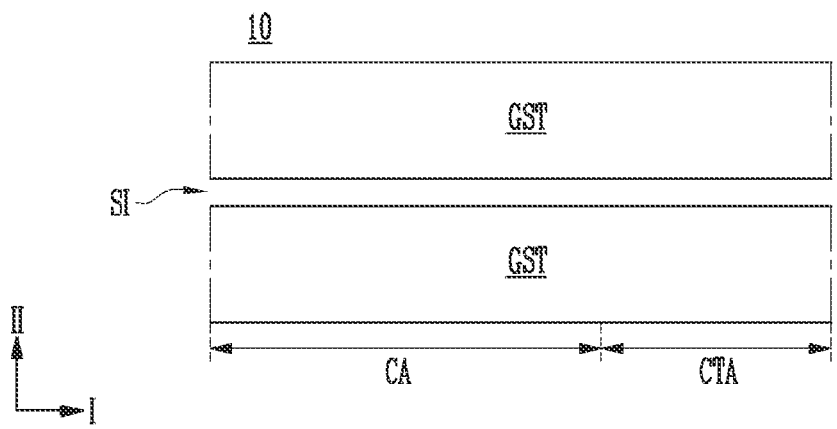
FIG. 1 is a view schematically illustrating gate stack structures of a semiconductor memory device in accordance with an embodiment of the present disclosure.

FIG. 1 is a view schematically illustrating gate stack structures GST of a semiconductor memory device 10 in accordance with an embodiment of the present disclosure. FIG. 1 illustrates a portion of each of the gate stack structures GST.

Referring to FIG. 1, the semiconductor memory device 10 may include gate stack structures GST separated from each other by a slit SI. The gate stack structures GST may be formed on a substrate including a cell region CA and a contact region CTA.

The slit SI may extend in a first direction I. The gate stack structures GST may be arranged to be spaced apart from each other in a second direction II intersecting the first direction I.

Figure 2A:
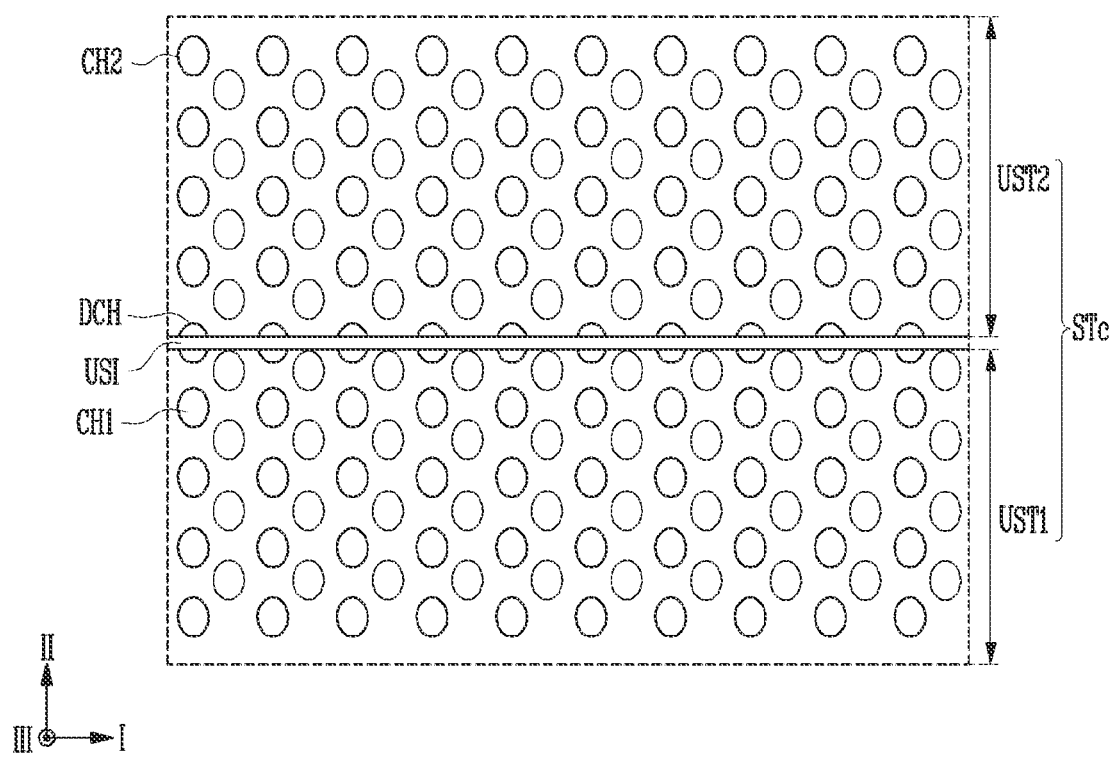
Figure 4A:
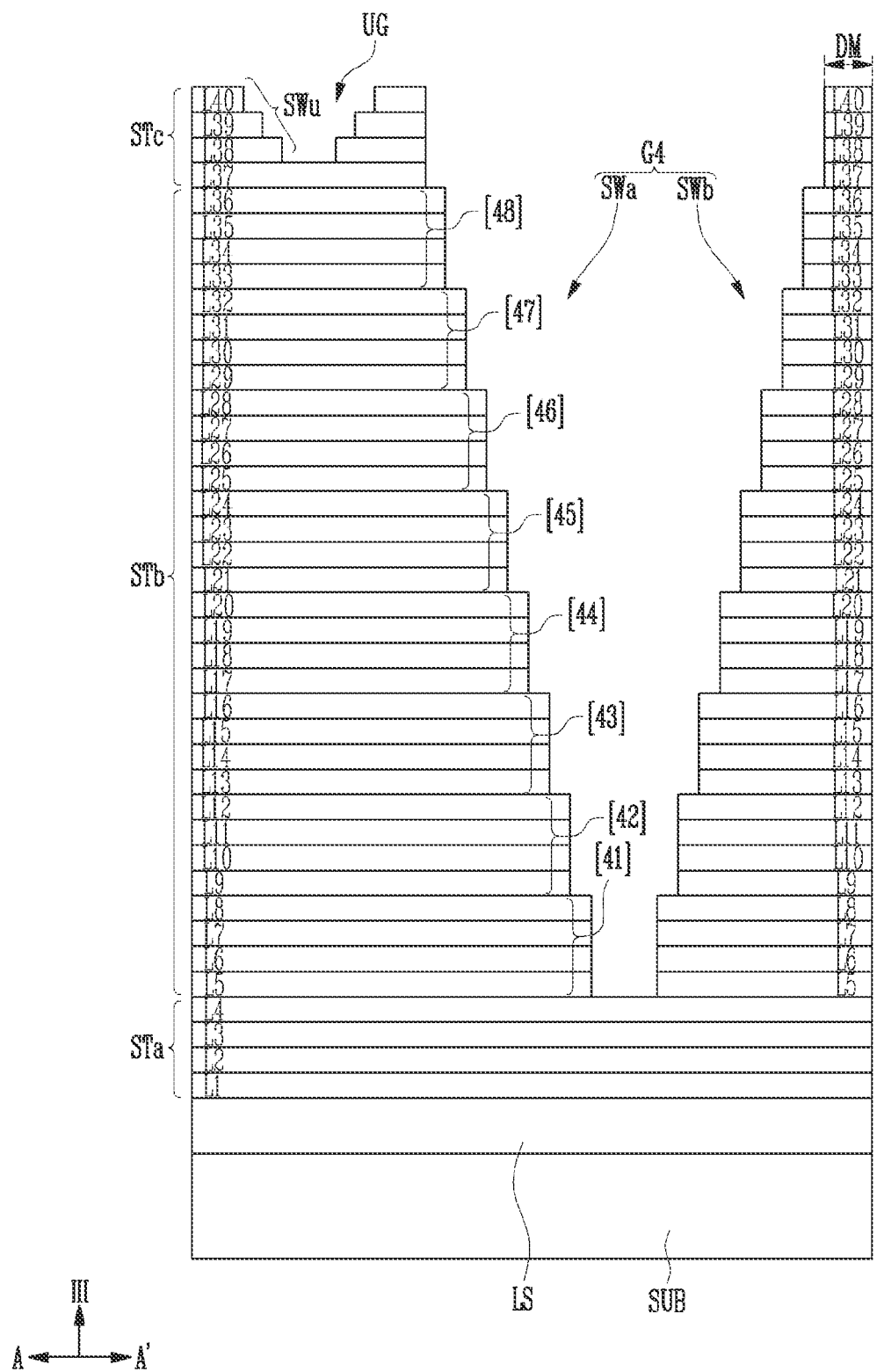
FIGS. 4A to 4C are sectional views of a gate stack structure in accordance with an embodiment of the present disclosure.
Figure 4B:
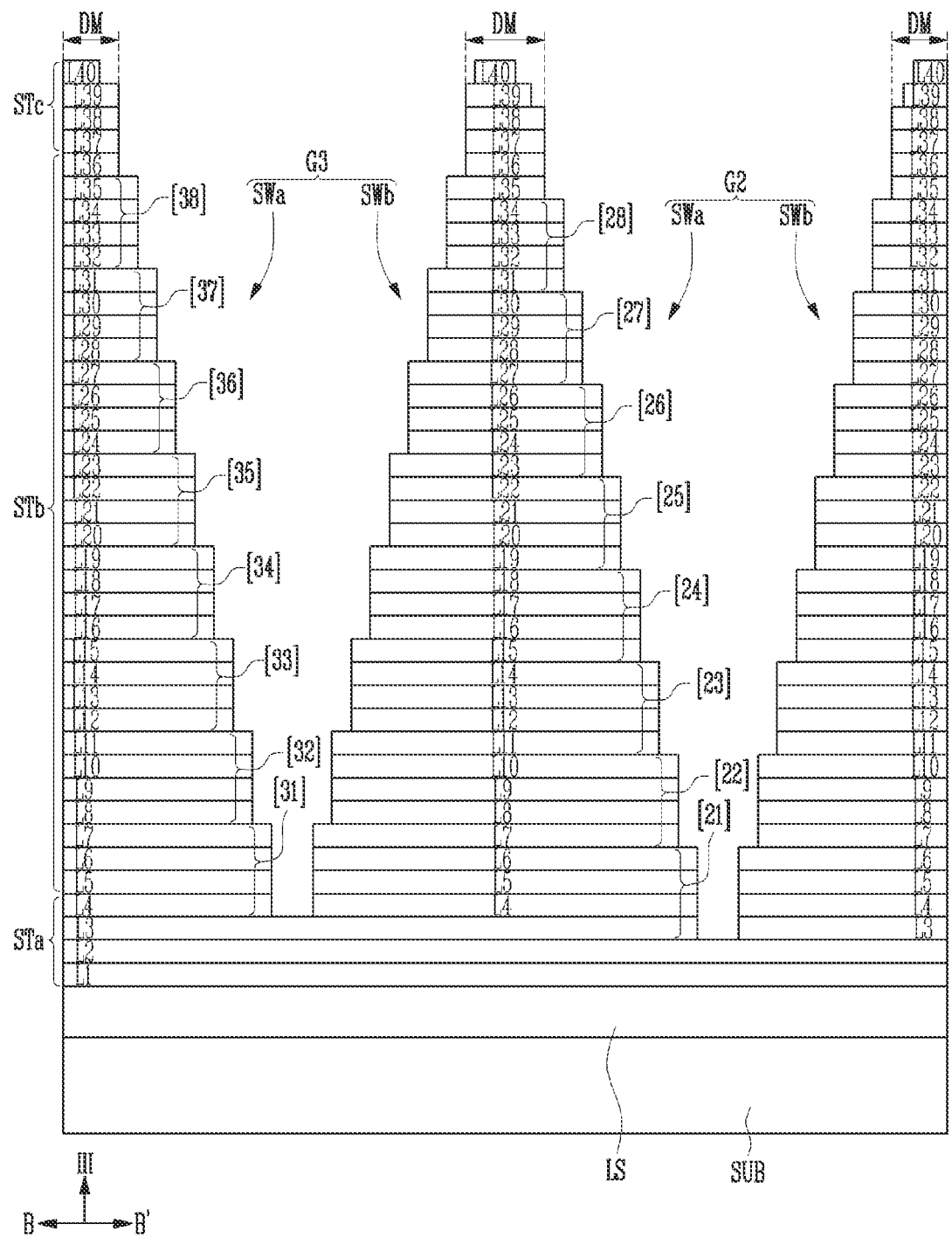
Figure 4C:
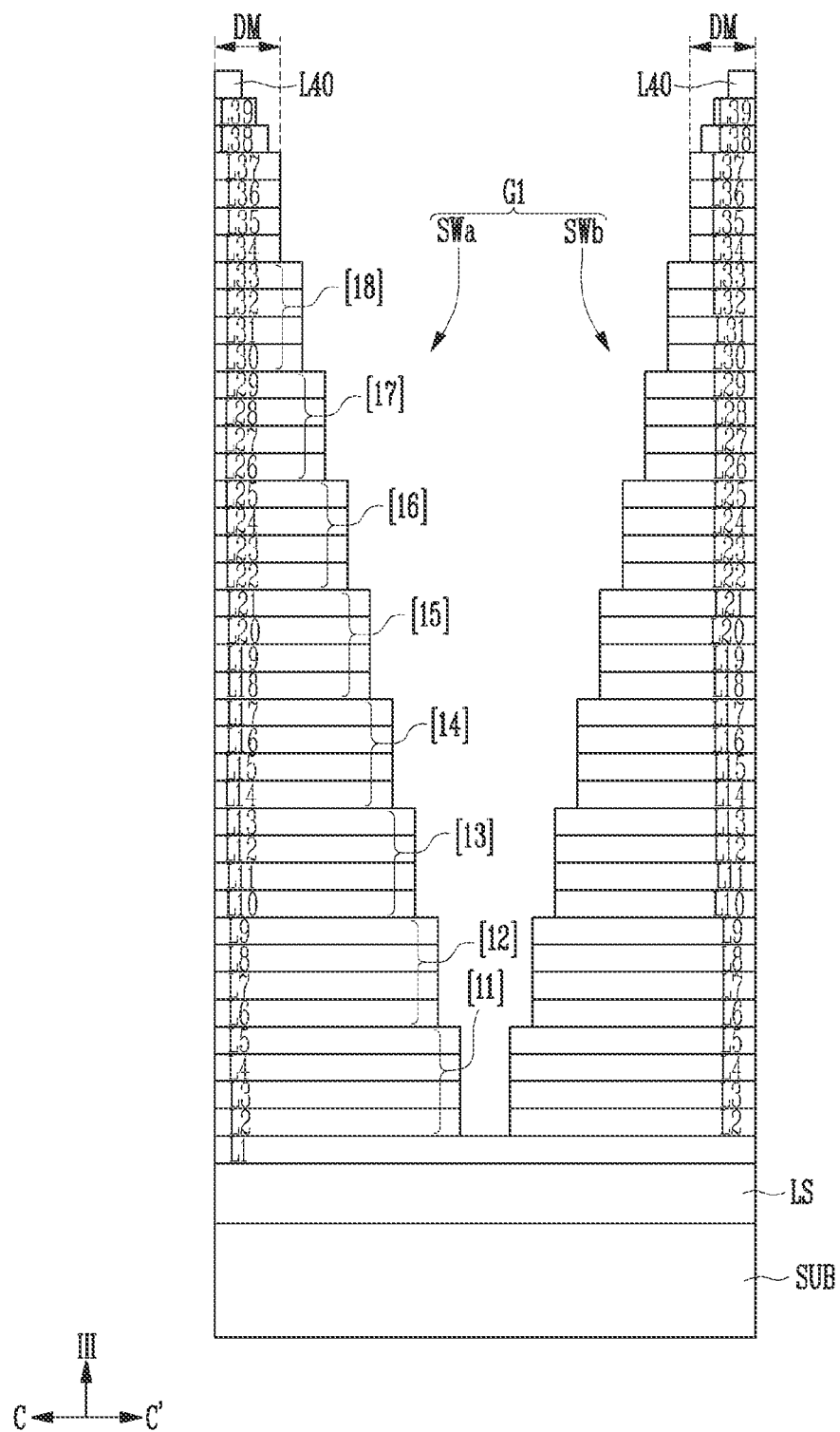

FIGS. 2A and 2B are plan views schematically illustrating a portion of each gate stack structure GTS overlapping with the cell region CA shown in FIG. 1. The gate stack structure GST may include a lower stack structure STa, an intermediate stack structure STb, and an upper stack structure STc, which are sequentially stacked as shown in FIGS. 4A to 4C. Each of the lower stack structure STa, the intermediate stack structure STb, and the upper stack structure STc may extend to the contact region CTA from the cell region CA shown in FIG. 1.

Referring to FIGS. 2A and 2B, each of the upper stack structure STc and the intermediate stack structure STb may be penetrated by channel structures CH1 and CH2 on the cell region CA shown in FIG. 1. The channel structures CH1 and CH2 may extend in a vertical direction III orthogonal to a plane parallel to the first direction I and the second direction II.

The upper stack structure STc may be separated into a plurality of upper select structures UST1 and UST2. For example, as shown in FIG. 2A, the upper stack structure STc may be separated into a first upper select structure UST1 and a second upper select structure UST2 by an upper slit USI extending in the first direction I. The shape of the upper slit USI is not limited to that illustrated in the drawing, and the upper slit USI may be formed in various shapes including a straight line shape, a zigzag shape, a wave shape, and the like.

The channel structures CH1 and CH2 may include a first channel structure CH1 disposed at one side of the upper slit USI and a second channel structure CH2 disposed at the other side of the upper slit USI. The upper stack structure STc and the intermediate stack structure STb may be penetrated by dummy channel structures DCH. The dummy channel structures DCH may be arranged along the extending direction of the upper slit USI, and overlap with the upper slit USI.

The upper slit USI may be formed to a depth to which the upper slit USI does not penetrate the intermediate stack structure STb shown in FIG. 2B. Accordingly, the first channel structures CH1 surrounded by the intermediate stack structure STb is distinguished from the second channel structures CH2 surrounded by the intermediate stack structure STb, so that the first channel structures CH1 and the second channel structures CH2 can be individually selected. For example, a signal for selecting the first channel structures CH1 may be applied to the first upper select structure UST1, and a signal for not selecting the second channel structures CH2 may be applied to the second upper select structure UST2.

Although not shown in the drawings, the lower stack structure STa shown in FIGS. 4A to 4C may be formed with a layout substantially identical to that of the upper stack structure STc shown in FIG. 2A, or be formed with a layout substantially identical to that of the intermediate stack structure STb shown in FIG. 2B.

In another embodiment, the upper slit USI may be omitted. Therefore, the upper stack structure STc may be formed with a layout substantially identical to that of the intermediate stack structure STb, and the dummy channel structures DCH may be omitted. In addition, the first channel structures CH1 and the second channel structures CH2 may be controlled by the same upper select structure. The first channel structures CH1 and the second channel structures CH2 may be individually selected through bit lines (not shown) connected to the top thereof.

Figure 3B:
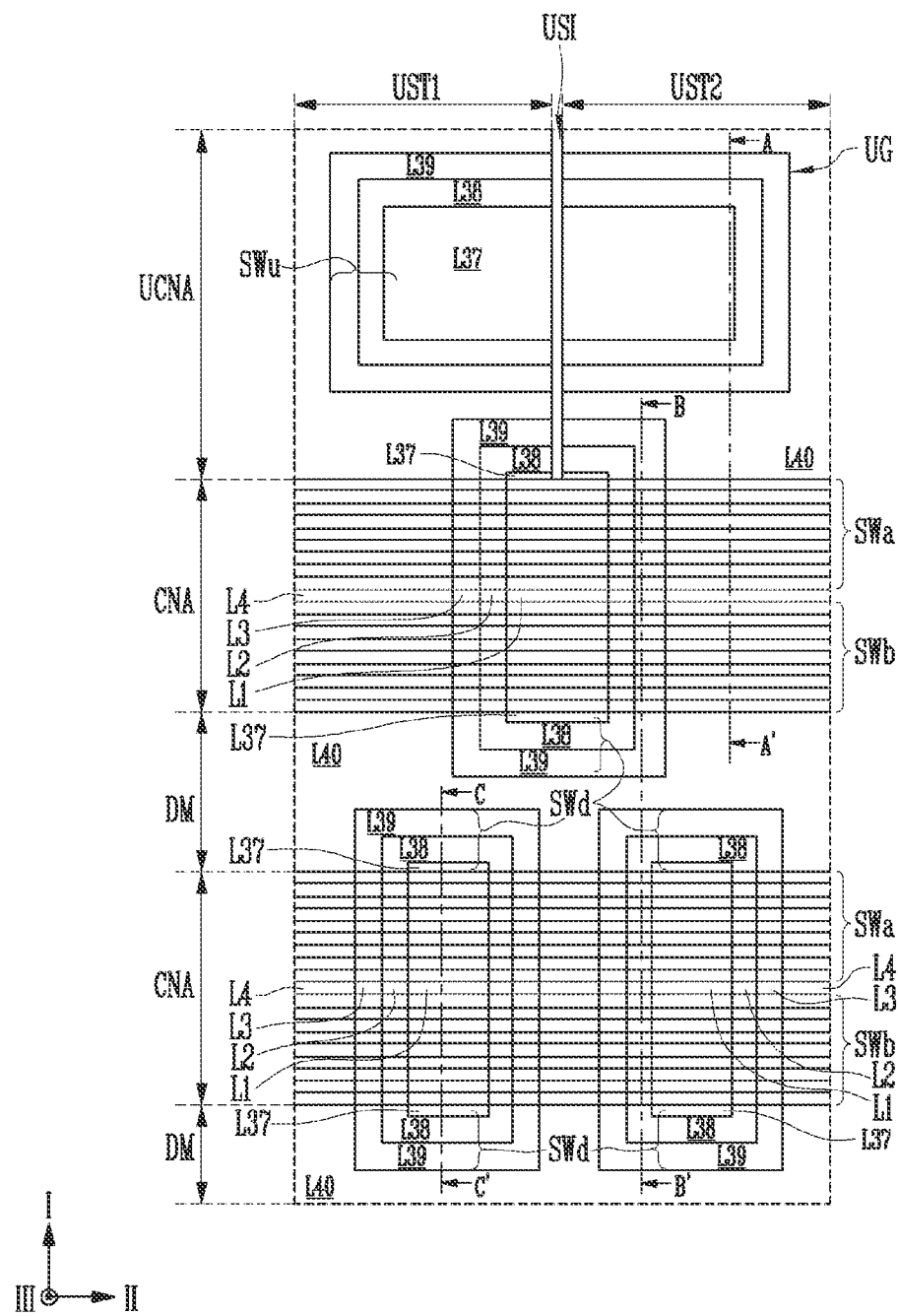

FIGS. 3A and 3B are plan views illustrating various embodiments of a portion of each gate stack structure GST overlapping with the contact region CTA shown in FIG. 1.

Referring to FIGS. 3A and 3B, each gate stack structure may include an upper connection region UCNA and a plurality of connection regions CNA, which overlap with the contact region CTA shown in FIG. 1. The connection regions CNA may be spaced apart from the upper connection region UCNA in the first direction I. The upper connection region UCNA may be disposed more adjacent to the cell region CA shown in FIG. 1 than the connection regions CNA. The upper slit USI shown in FIG. 2A may extend to cross the upper connection region UCNA. The upper slit USI may extend toward a connection region adjacent to the upper connection region UCNA among the connection regions CNA.

The upper connection region UCNA may include an upper step structure SWu. The upper step structure SWu may be formed in each of the upper select structures UST1 and UST2 separated by the upper slit USI. The upper step structure SWu may be formed along a sidewall of an upper groove UG. The upper groove UG may be formed in the upper stack structure STc shown in FIGS. 4A to 4C. The upper stack structure STc may include a plurality of upper layers L37 to L40 stacked in the vertical direction III on the intermediate stack structure STb shown in FIGS. 4A to 4C. The upper layers L37 to L40 may include a first upper layer L37 disposed in the lowermost layer and two or more second upper layers L38 to L40 stacked in the vertical direction III on the first upper layer L37. The second upper layers L38 to L40 may respectively constitute upper steps forming the upper step structure SWu.

The upper layers L37 to L40 may form a dummy structure DM by remaining between adjacent connection regions CNA. The dummy structure DM may include a dummy step structure SWd formed with the upper layers L37 to L40. The dummy structure DM may be separated from the upper select structures UST1 and UST2. In other words, the upper stack structure STc may be separated into the upper select structures UST1 and UST2 and at least one dummy structure DM.

The connection regions CNA may be disposed to be spaced apart from each other. The connection regions CNA may include first step structures SWa and second step structures SWb, which form a plurality of pairs. Each pair of first and second step structures SWa and SWb may be disposed to face each other. Each pair of first and second step structures SWa and SWb may be formed on one lower layer corresponding thereto among lower layers L1 to L4. The lower layers L1 to L4 may be stacked in the vertical direction III to constitute the lower stack structure STa shown in FIGS. 4A to 4C.

Each of the connection regions CNA may include at least one pair of first to second step structures SWa and SWb. In an example, referring to FIG. 3A, a connection region adjacent to the upper connection region UCNA among the connection regions CNA may be configured with a pair of first to second step structures SWa and SWb, and each of the other connection regions may include a plurality of step structures SWa and a plurality of second step structures SWb, which are formed on the top of each of the lower layers L1 to L4. In another example, referring to FIG. 3B, each of the connection regions CNA may include a plurality of step structures SWa and a plurality of second step structures SWb, which are formed on the top of each of the lower layers L1 to L4.

FIGS. 4A to 4C are sectional views of a gate stack structure in accordance with an embodiment of the present disclosure. FIG. 4A illustrates a section of the gate stack structure taken along line A-A' shown in FIG. 3A or 3B. FIG. 4B illustrates a section of the gate stack structure taken along line B-B' shown in FIG. 3A or 3B. FIG. 4C illustrates a section of the gate stack structure taken along line C-C' shown in FIG. 3A or 3B.

Referring to FIGS. 4A to 4C, the lower stack structure STa, the intermediate stack structure STb, and the upper stack structure STc may be stacked on a substrate SUB. A lower structure LS may be formed between the substrate SUB and the lower stack structure STa.

The substrate SUB may include the cell region CA and a contact region CTA, which are described with reference to FIG. 1. FIGS. 4A to 4C illustrate the contact region CTA of the substrate SUB. The substrate SUB may include at least one of silicon (Si), germanium (Ge), silicon germanium (SiGe), gallium arsenic (GaAs), indium gallium arsenic (InGaAs), aluminum gallium arsenic (AlGaAs), and any mixture thereof. The substrate SUB may be a silicon on insulator substrate, a germanium substrate, a germanium on insulator substrate, a silicon-germanium substrate, or an epitaxial thin film formed through a selective epitaxial growth process.

The lower structure LS may include various components. In an embodiment, the lower structure may include a peripheral circuit formed on the substrate SUB and an insulating layer covering the peripheral circuit. The peripheral circuit may include a row decoder, a page buffer, a column decoder, and the like. In another embodiment, the lower structure LS may include a pipe gate or a doped silicon layer, which is connected to a three-dimensional memory string. The pipe gate may be used as a gate of a pipe transistor. The doped silicon layer may be used as a source region or well region. The lower structure LS may be variously modified according to designs of the semiconductor memory device.

The intermediate stack structure STb may include a plurality of intermediate layers L5 to L36 stacked in the vertical direction III between the lower stack structure STa and the upper stack structure STc. A stacked number of the upper layers L37 to L40 of the upper stack structure STc may be equal to that of the lower layers L1 to L4 of the lower stack structure STa. A stacked number of the intermediate layers L5 to L36 of the intermediate stack structure STb may be greater than that of the lower layers L1 to L4 included in the lower stack structure STa, and be greater than that of the upper layers L37 to L40 included in the upper stack structure STc.

The intermediate stack structure STb may be penetrated by a plurality of grooves G1 to G4. The grooves G1 to G4 may expose the lower stack structure STa in different depths. The lower layers L1 to L4 may be respectively exposed by bottom surfaces of the grooves G1 to G4. Each of the bottom surfaces of the grooves G1 to G4 may be coplanar with a corresponding upper surface among upper surfaces of the lower layers L1 to L4. For example, the groove G4 opening the uppermost lower layer L4 among the lower layers L1 to L4 may include a bottom surface being coplanar with the upper surface of the uppermost lower layer L4.

The grooves G1 to G3 having bottom surfaces respectively defined by the upper surfaces of the other lower layers L1 to L3 except the uppermost lower layer L4 among the lower layers L1 to L4 may extend to the inside of the lower stack structure STa in different depths.

The upper groove UG may be formed in the upper stack structure STc as described with reference to FIGS. 3A and 3B. A bottom surface of the upper groove UG may be coplanar with the upper surface of the first upper layer L37. Upper steps formed along the sidewall of the upper groove UG may be respectively configured with the second upper layers L38 to L40.

The upper stack structure STc may remain at the periphery of each of the grooves G1 to G4. The upper stack structure STc remaining between adjacent grooves G1 to G4 may constitute the dummy structure DM described with reference to FIG. 3A or 3B. Each of the intermediate layers L5 to L36 and the lower layers L1 to L4 may extend to overlap with the upper groove UG and the dummy structure DM.

A plurality of steps [11] to [18], [21] to [28], [31] to [38], and [41] to [48] may be formed along sidewalls of the grooves G1 to G4. A height from a bottom to a top of each of the steps [11] to [18], [21] to [28], [31] to [38], and [41] to [48] may be greater than a height from a bottom to a top of each of the upper steps forming the upper step structure SWu. In an embodiment, each of the steps [11] to [18], [21] to [28], [31] to [38], and [41] to [48] may be formed with a greater depth than each of the upper steps forming the upper step structure SWu.

Each of the steps [11] to [18], [21] to [28], [31] to [38], and [41] to [48] may be configured with two or more layers consecutively stacked among the lower layers L2 to L4 and the intermediate layers L5 to L36. Stacked numbers of layers respectively constituting the steps [11] to [18], [21] to [28], [31] to [38], and [41] to [48] may be equal to each other. For example, a stacked number of layers constituting each of the steps [11] to [18], [21] to [28], [31] to [38], and [41] to [48] may be equal to that of the lower layers L1 to L4 constituting the lower stack structure STa. Each of the lower layers L2 to L4 and the intermediate layers L5 to L36 may include a sidewall, which is coplanar with a surface of a step corresponding thereto among the steps [11] to [18], [21] to [28], [31] to [38], and [41] to [48].

The lower layers L2 to L4 and the intermediate layers L5 to L36 may be substantially formed with the same thickness. Therefore, the steps [11] to [18], [21] to [28], [31] to [38], and [41] to [48] may substantially have the same height. In addition, a height of each of the steps [11] to [18], [21] to [28], [31] to [38], and [41] to [48] may be formed substantially equal to that of the lower stack structure STa.

The steps [11] to [18], [21] to [28], [31] to [38], and [41] to [48] may be divided into a plurality of groups corresponding to the grooves G1 to G4. Different groups of the steps may be disposed at different levels. Different groups of the steps may share at least one among the lower layers L2 to L4 and the intermediate layers L5 to L36. Each of upper surfaces of the intermediate layers L5 to L36 may include a portion, which is coplanar with a surface of a step corresponding thereto among surfaces of the steps [11] to [18], [21] to [28], [31] to [38], and [41] to [48].

For example, the grooves may include a first groove G1, a second groove G2, a third groove G3, and a fourth groove G4. The lower layers may include a first lower layer L1, a second lower layer L2, a third lower layer L3, and a fourth lower layer L4. An upper surface of the first lower layer L1 may be exposed by the bottom surface of the first groove G1, an upper surface of the second lower layer L2 may be exposed by the bottom surface of the second groove G2, an upper surface of the third lower layer L3 may be exposed by the bottom surface of the third groove G3, and an upper surface of the fourth lower layer L4 may be exposed by the bottom surface of the fourth groove G4. The steps may include a first group configured with first steps [11] to [18], a second group configured with second steps [21] to [28], a third group configured with third steps [31] to [38], and a fourth group configured with fourth steps [41] to [48].

The first group of the first steps [11] to [18] may be stacked on the first lower layer L1, and be formed along each of the sidewalls of the first groove G1 to form a first step structure SWa and a second step structure SWb of the first groove G1. The second group of the second steps [21] to [28] may be stacked on the second lower layer L2, and be formed along each of the sidewalls of the second groove G2 to form a first step structure SWa and a second step structure SWb of the second groove G2. The third group of the third steps [31] to [38] may be stacked on the third lower layer L3, and be formed along each of the sidewalls of the third groove G3 to form a first step structure SWa and a second step structure SWb of the third groove G3. The fourth group of the fourth steps [41] to [48] may be stacked on the fourth lower layer L4, and be formed along each of the sidewalls of the fourth groove G4 to form a first step structure SWa and a second step structure SWb of the fourth groove G4. The first steps [11] to [18], the second steps [21] to [28], the third steps [31] to [38], and the fourth steps [41] to [48] may be configured with layers having the same stacked number. For example, the first steps [11] to [18], the second steps [21] to [28], the third steps [31] to [38], or the fourth steps [41] to [48] may include four layers consecutively stacked in each corresponding step.

In accordance with an embodiment, the second group of the second steps [21] to [28] may be disposed at a level higher than that of the first group of the first steps [11] to [18], the third group of the third steps [31] to [38] may be disposed at a level higher than that of the second group of the second steps [21] to [28], and the fourth group of the fourth steps [41] to [48] may be disposed at a level higher than that of the third group of the third steps [31] to [38]. In addition, first intermediate layers L5, L9, L13, L17, L21, L25, L29, and L33 disposed at different levels may be exposed by the first steps [11] to [18]. Second intermediate layers L6, L10, L14, L18, L22, L26, L30, and L34 disposed at different levels may be exposed by the second steps [21] to [28]. Third intermediate layers L7, L11, L15, L19, L23, L27, L31, and L35 disposed at different levels may be exposed by the third steps [31] to [38]. Fourth intermediate layers L8, L12, L16, L20, L24, L28, L32, and L36 disposed at different levels may be exposed by the fourth steps [41] to [48].

In accordance with an embodiment, the first intermediate layers L5, L9, L13, L17, L21, L25, L29, and L33 may be respectively included in the second steps [21] to [28], be respectively included in the third steps [31] to [38], and be respectively included in the fourth steps [41] to [48].

In accordance with an embodiment, the upper layers L37 to L40 may have upper surfaces exposed by the upper groove UG. In addition, the lower layers L1 to L4 and the intermediate layers L5 to L36 may have upper surfaces exposed by the grooves G1 to G4. The upper surfaces of the upper layers L37 to L40, the lower layers L1 to L4, and the intermediate layers L5 to L36 may be in contact with contact plugs through the upper groove UG and the grooves G1 to G4.

Although a case where the lower stack structure STa includes four lower layers L1 to L4 and the upper stack structure STc includes four upper layers L37 to L40 is illustrated in FIGS. 4A to 4C, the present disclosure is not limited thereto. The stacked number of layers defining steps of each of the first step structure SWa and the second step structure SWb may also be modified.

Figure 5B:
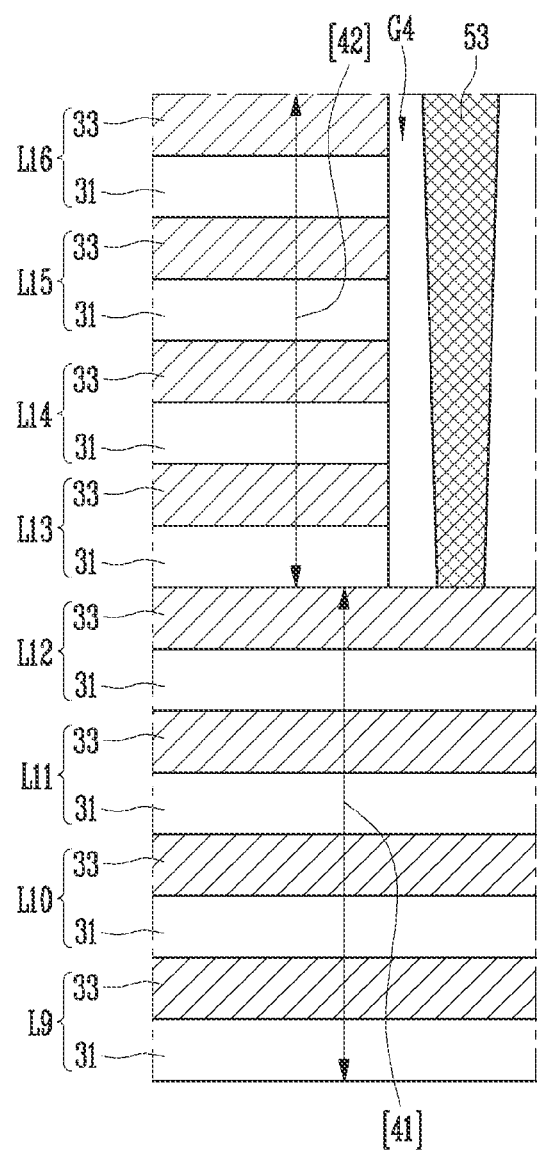

FIGS. 5A to 5C are sectional views illustrating contact plugs formed in the connection regions in accordance with an embodiment of the present disclosure.

FIG. 5A illustrates first contact plugs 51 connected to the upper stack structure STc through the upper groove UG shown in FIG. 4A.

Referring to FIG. 5A, the upper stack structure STc shown in FIGS. 4A to 4C may include upper interlayer insulating layers 21 and upper electrodes 23, which are alternately stacked. Each of the upper layers L37 to L40 may include a pair of the upper interlayer insulating layer 21 and the upper electrode 23, corresponding thereto. Although a case where each of the upper layers L37 to L40 includes the upper interlayer insulating layer 21 corresponding thereto and the upper electrode 23 stacked on the top of the upper interlayer insulating layer 21 is illustrated in FIG. 5A, the present disclosure is not limited thereto. For example, each of the upper layers L37 to L40 may include the upper electrode 23 corresponding thereto and the upper interlayer insulating layer 21 stacked on the top of the upper electrode 23.

The upper electrodes 23 may include a first upper electrode disposed in the lowermost layer and second upper electrodes stacked on the first upper electrode. The first upper electrode may include an upper surface opened by the bottom of the upper groove UG. The second upper electrodes may respectively constitute upper steps forming a step structure along the sidewall of the upper groove UG. The second upper electrodes may include upper surfaces opened by the upper steps. The upper surface of the first upper electrode opened by the upper groove UG and the upper surfaces of the second upper electrodes opened by the upper steps may be connected to first contact plugs 51. The first contact plugs 51 may be respectively connected to the upper electrode 23, and extend in the vertical direction. Although not shown in the drawing, when the upper interlayer insulating layers 21 extend to cover the upper surfaces of the upper electrodes 23, the first contact plugs 51 may penetrate the upper interlayer insulating layers 21.

FIG. 5B is a view illustrating a second contact plug 53 connected to each of the steps [11] to [18], [21] to [28], [31] to [38], and [41] to [48] shown in FIGS. 4A to 4C. FIG. 5B representatively illustrates the fourth step 41 connected to the second contact plug 53.

Referring to FIG. 5B, the intermediate stack structure STb shown in FIGS. 4A to 4C may include intermediate interlayer insulating layers 31 and intermediate electrodes 33, which are alternately stacked. Each of the intermediate layers L5 to L36 shown in FIGS. 4A to 4C may include a pair of the intermediate interlayer insulating layer 31 and the intermediate electrode 33, corresponding thereto. Although a case where each of the intermediate layers L5 to L36 shown in FIGS. 4A to 4C includes the intermediate interlayer insulating layer 31 corresponding thereto and the intermediate electrode 33 stacked on the top of the intermediate interlayer insulating layer 31 is illustrated in FIG. 5B, the present disclosure is not limited thereto. For example, each of the intermediate layers L5 to L36 shown in FIGS. 4A to 4C may include the intermediate electrode 33 corresponding thereto and the intermediate interlayer insulating layer 31 stacked on the top of the intermediate electrode 33.

Each of the intermediate electrodes 33 stacked in the vertical direction may be connected to the corresponding second contact plug 53. The second contact plug 53 may be connected to the uppermost intermediate electrode corresponding thereto among intermediate electrodes 33 included in each of the steps [11] to [18], [21] to [28], [31] to [38], and [41] to [48] shown in FIGS. 4A to 4C. For example, one [41] of the fourth steps forming a step structure along the sidewall of the fourth groove G4 may include four intermediate electrodes stacked in the vertical direction. The second contact plug 53 may be connected to an intermediate electrode disposed in the uppermost layer among the four intermediate electrodes. The second contact plug 53 may be connected to an intermediate electrode corresponding thereto, and extend in the vertical direction. Although not shown in the drawing, when the intermediate interlayer insulating layers 31 extend to cover upper surfaces of the intermediate electrode 33, the second contact plug 53 may penetrate the intermediate interlayer insulating layer 31 covering the uppermost intermediate electrode corresponding thereto.

FIG. 5C is a view illustrating a third contact plug 55 connected to each of the lower layers L1 to L4 shown in FIGS. 4A to 4C. FIG. 5C representatively illustrates the first lower layer L1 connected to the third contact plug 55.

Referring to FIG. 5C, the lower stack structure STa shown in FIGS. 4A to 4C may include lower interlayer insulating layers 41 and lower electrodes 43, which are alternately stacked. Each of the lower layers L1 to L4 shown in FIGS. 4A to 4C may include a pair of the lower interlayer insulating layer 41 and the lower electrode 43, corresponding thereto. Although a case where each of the lower layers L1 to L4 shown in FIGS. 4A to 4C includes the lower interlayer insulating layer 41 corresponding thereto and the lower electrode 43 stacked on the top of the lower interlayer insulating layer 41 is illustrated in FIG. 5C, the present disclosure is not limited thereto. For example, each of the lower layers L1 to L4 shown in FIGS. 4A to 4C may include the lower electrode 43 corresponding thereto and the lower interlayer insulating layer 41 stacked on the top of the lower electrode 43.

Each of the lower electrodes 43 stacked in the vertical direction may be connected to third contact plug 55. The third contact plug 55 may be connected to a lower electrode opened through the bottom surface of each of the grooves G1 to G4 shown in FIGS. 4A to 4C. For example, a first lower electrode of the first lower layer L1, which is opened through the bottom surface of the first groove G1, may be connected to the third contact plug 55 corresponding thereto. Although not shown in the drawing, when the lower interlayer insulating layer 41 extends to cover upper surfaces of the lower electrodes 43, the third contact plug 55 may penetrate the lower interlayer insulating layer 41 corresponding thereto.

Referring to FIGS. 5A to 5C, a stacked number of the upper electrodes 23 constituting the upper stack structure may be equal to that of the lower electrodes 43 constituting the lower stack structure. Each of the steps [11] to [18], [21] to [28], [31] to [38], and [41] to [48] shown in FIGS. 4A to 4C may include two or more electrodes among the intermediate electrodes 33 and the lower electrodes 43. A stacked number of two or more electrodes constituting each step may be equal to that of the lower electrodes 43 constituting the lower stack structure. Each of sidewalls of two or more electrodes constituting each step may be coplanar with a sidewall of a step corresponding thereto.

The lower electrodes 43, the intermediate electrodes 33, and the upper electrodes 23 may be used as gate electrodes of a three-dimensional semiconductor memory device. The gate electrodes of the three-dimensional semiconductor memory device may include word lines connected to memory cells and select lines connected to select transistors. The lower electrodes 43, the intermediate electrodes 33, and the upper electrodes 23 may be used as the word lines and the select lines.

FIGS. 6, 7A and 7B, 8, 9, 10A and 10B, 11, and 12 are views illustrating a manufacturing method of a semiconductor memory device in accordance with an embodiment of the present disclosure. The semiconductor memory device shown in FIG. 3A may be implemented using manufacturing methods which will be described later with reference to FIGS. 6, 7A and 7B, 8, 9, 10A and 10B, 11, and 12.

FIGS. 6, 7A, and 7B are views illustrating a process of forming an upper groove 110A and a plurality of preliminary grooves 110B to 110D in a stack structure ES to be etched. FIG. 6 is a plan view illustrating the upper groove 110A and the preliminary grooves 110B to 110D, which are formed in the stack structure ES to be etched. FIG. 7A is a sectional view of the stack structure ES to be etched, which is taken along line D-D' shown in FIG. 6. FIG. 7B is a sectional view of the stack structure ES to be etched, which is taken along line E-E' shown in FIG. 6.

Referring to FIGS. 6, 7A, and 7B, the stack structure ES to be etched may extend along a first direction I and a second direction II, which intersect each other. In an embodiment, the stack structure ES to be etched may be formed on the substrate SUB including the cell region and the contact region, which is described with reference to FIGS. 4A to 4C. FIGS. 6, 7A, and 7B illustrate a portion of the stack structure ES to be etched, which overlaps with the contact area on the substrate. Although not shown in the drawings, the stack structure ES to be etched may extend to the cell region on the substrate.

The stack structure ES to be etched may include a first stack structure ST1, a second stack structure ST2, and a third stack structure ST3, which are stacked along a vertical direction III. The vertical direction III may perpendicularly intersect a plane extending along the first direction I and the second direction II.

The first stack structure ST1 may include a plurality of lower layers LL1 to LL4 stacked in the vertical direction III. The second stack structure ST2 may include a plurality of intermediate layers ML1 to ML32 stacked in the vertical direction III on the first stack structure ST1. The third stack structure ST3 may include a plurality of upper layers UL1 to UL4 stacked in the vertical direction III on the second stack structure ST2.

Each of the lower layers LL1 to LL4, the intermediate layers ML1 to ML32, and the upper layers UL1 to UL4 may include a first material layer and a second material layer stacked on the first material layer. In other words, each of the lower layers LL1 to LL4, the intermediate layers ML1 to ML32, and the upper layers UL1 to UL4 may be configured with a pair of the first material layer and the second material layer. The first material layer may be formed of a material different from that of the second material layer. In an embodiment, one of the first material layer and the second material layer may be formed of a conductive layer for electrodes, and the other of the first material layer and the second material layer may be formed of an insulating material for interlayer insulating layers. In another embodiment, one of the first material layer and the second material layer may be formed of a sacrificial layer capable of being replaced with the conductive layer in a subsequent process, and the other of the first material layer and the second material layer may be formed of the insulating material. In still another embodiment, one of the first material layer and the second material layer may be formed of a sacrificial layer capable of being replaced with the insulating material in a subsequent process, and the other of the first material layer and the second material layer may be formed of the conductive layer. The insulating material may include oxide. The conductive layer may include at least one of metal, metal silicide or doped silicon. The sacrificial layer capable of being replaced with the conductive layer may be formed of a material having an etching rate different from that of the insulating material, and include, for example, nitride. The sacrificial layer capable of being replaced with the insulating material may be formed of a material having an etching rate different from that of the conductive layer, and include, for example, undoped silicon.

Subsequently, an upper groove 110A and preliminary grooves 110B to 110D may be formed in the third stack structure ST3. The upper groove 110A and the preliminary grooves 110B to 110D may be spaced apart from each other. A distance D1 between the upper groove 110A and a preliminary groove 110B adjacent thereto may be wider than each of those D2 and D3 between adjacent preliminary grooves 110B to 110D.

The upper layers UL1 to UL4 may include a first upper layer UL1 disposed in the lowermost layer of the third stack structure ST3 and two or more second upper layers UL2 to UL4 stacked in the vertical direction III on the first upper layer UL1. Each of the upper groove 110A and the preliminary grooves 110B to 110D may be formed to expose an upper surface of the first upper layer UL1. A sidewall of each of the upper groove 110A and the preliminary grooves 110B to 110D may be formed in a step structure. The step structure may have upper steps respectively formed with the second upper layers UL2 to UL4.

In order to form the upper steps, first, a first mask pattern 115 may be formed on the stack structure ES to be etched. The first mask pattern 115 may include a photoresist pattern. Subsequently, an etching process of the third stack structure ST3, using the first mask pattern 115 as an etch barrier, and a trimming process of the first mask pattern 115 may be alternately repeated.

The etching process is performed to etch at least one of the second upper layers UL2 to UL4 by using the first mask pattern 115 as the etch barrier. The trimming process may be performed after the etching process. The etching process may be repeated whenever each of the second upper layers UL2 to UL4 is exposed through the trimming process.

For example, before the trimming process is performed, the first mask pattern 115 may include first openings OP1 spaced apart from each other. The trimming process is a process of removing a portion of the first mask pattern 115 such that the area of each of the first openings OP1 is expanded. The trimming process may be performed whenever the etching process of the third stack structure ST3 is repeated. Whenever the trimming process is repeated, the width of each of the first openings OP1 may be expanded in the order of ① and ②. Whenever the width of each of the first openings OP1 increases, the second upper layers UL2 to UL4 may be sequentially exposed, and the exposed second upper layers UL2 to UL4 may be etched as the etching process is repeated.

The size of each of the upper groove 110A and the preliminary grooves 110B to 110D may be variously modified.

Figure 8:
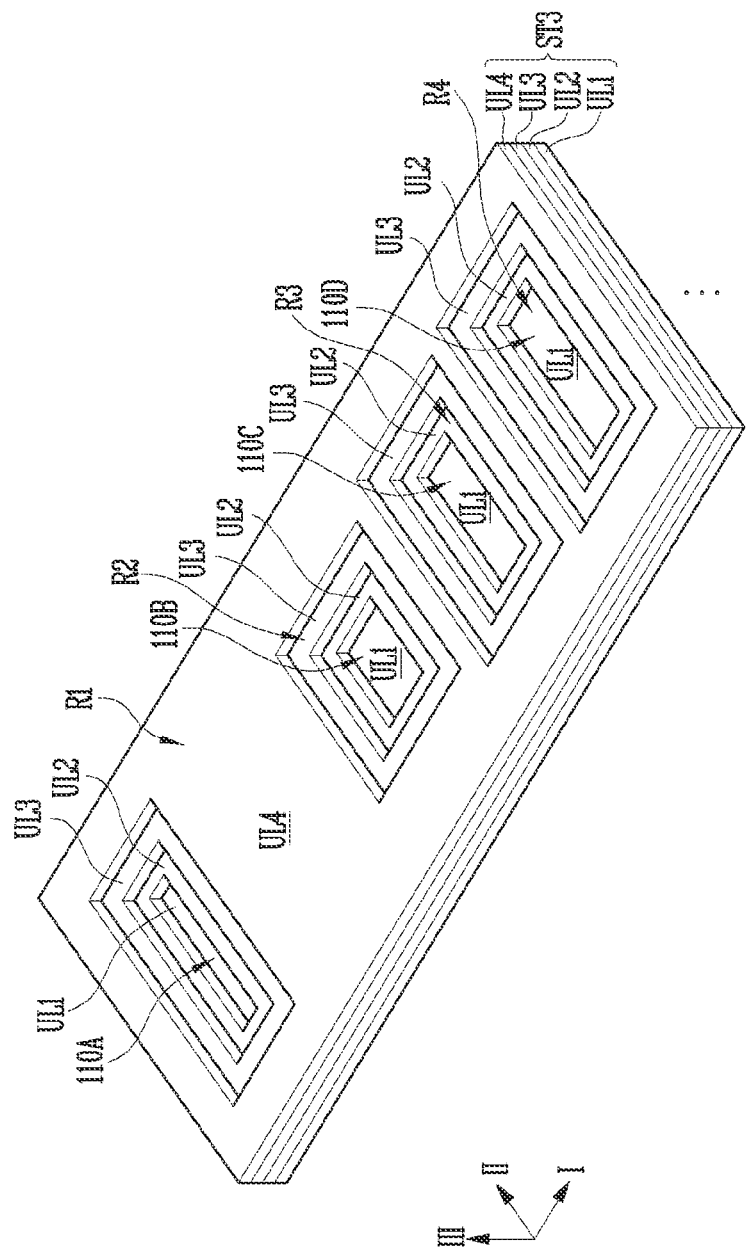

FIG. 8 is a perspective view illustrating reference regions R1 to R4 defined in the third stack structure ST3.

Referring to FIG. 8, after the upper groove 110A and the preliminary grooves 110B to 110D are formed, the first mask pattern 115 described with reference to FIGS. 6, 7A, and 7B may be removed. Accordingly, reference regions R1 to R4 defined on upper surfaces of the upper layers UL1 to UL4 of the third stack structure ST3 may be exposed.

The reference regions R1 to R4 may include a first reference region R1 exposing the uppermost second layer UL4 between the upper groove 110A and the preliminary groove 110B adjacent thereto and second reference regions R2 to R4 respectively defined in the preliminary grooves 110B to 110D. One R4 of the second reference regions R2 to R4 may expose the first upper layer UL1, and the others of the second reference regions R2 to R4 may respectively expose the other second upper layers UL2 and UL3 except the uppermost second upper layer UL4 among the second upper layers UL2 to UL4.

Figure 9:
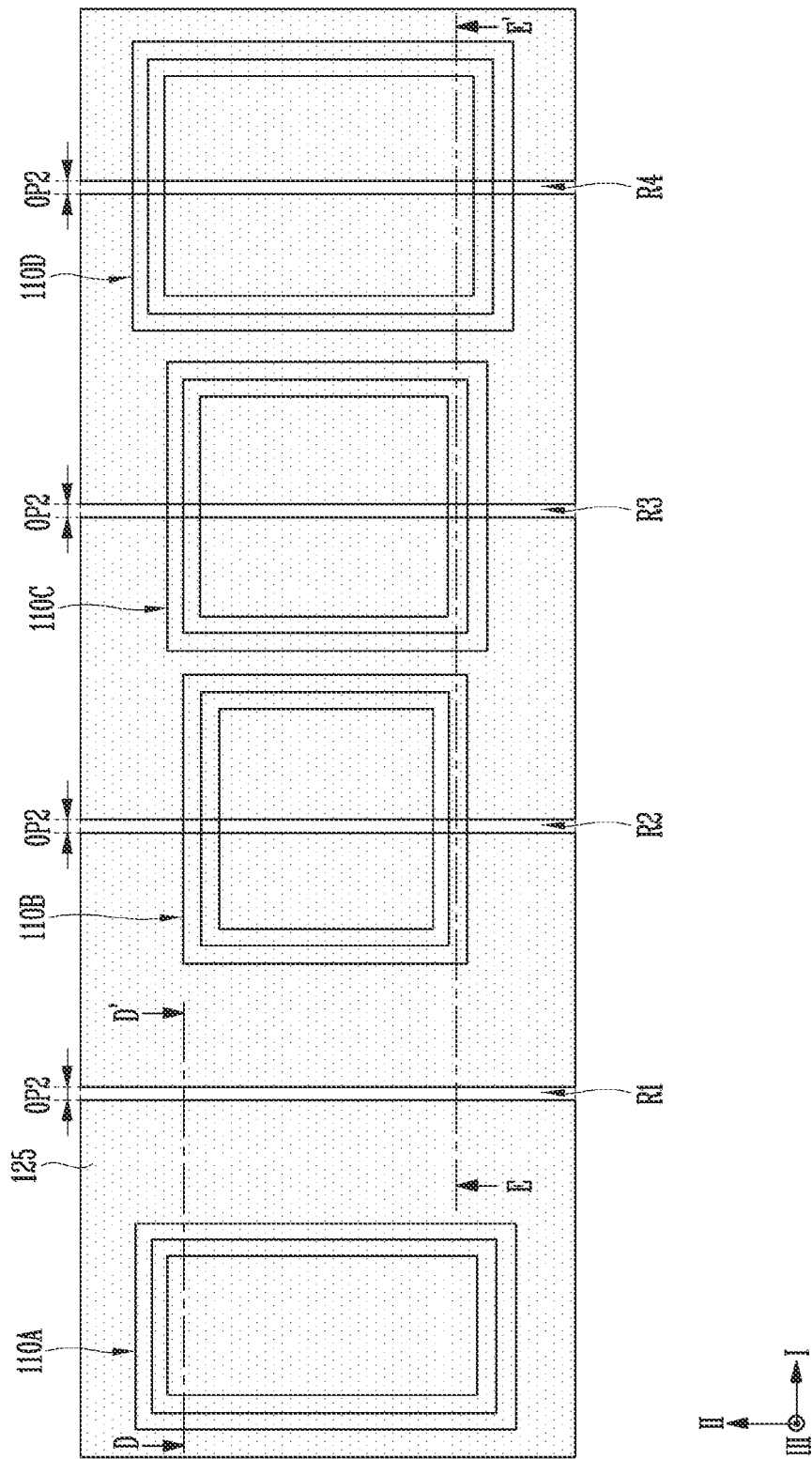
Figure 10A:
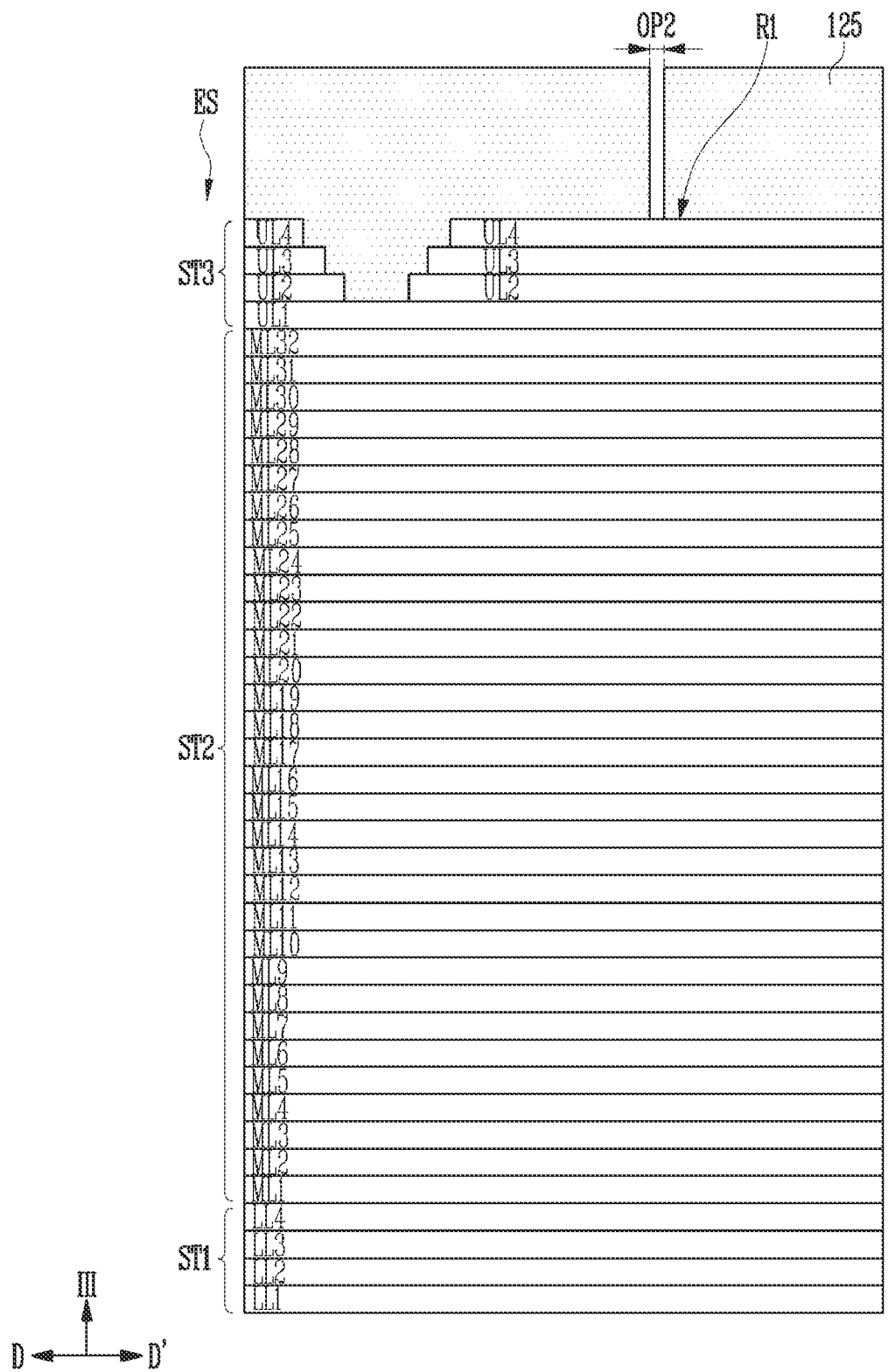
Figure 10B:
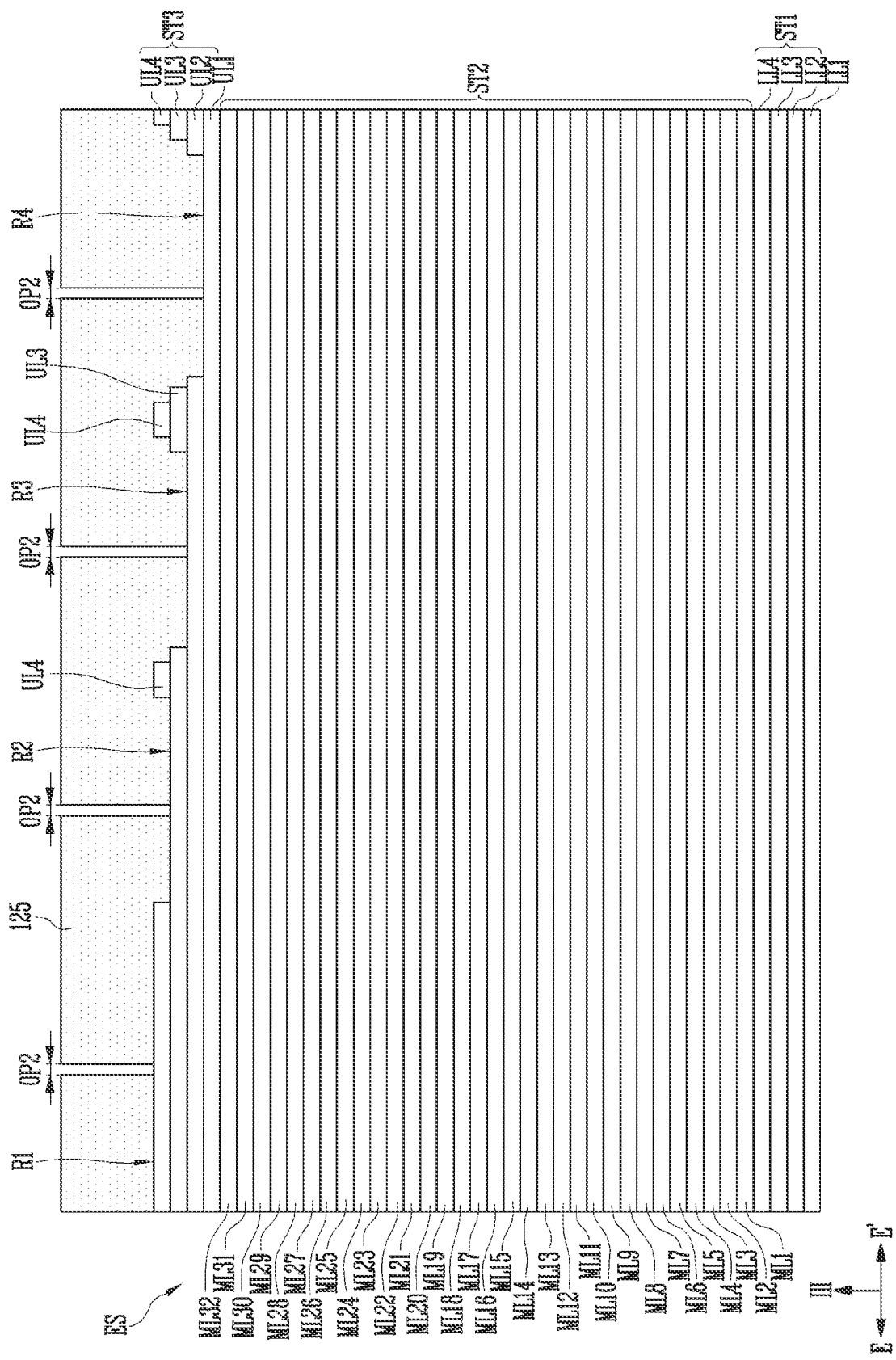

FIGS. 9, 10A and 10B are views illustrating a second mask pattern 125. FIG. 9 is a plan view illustrating the second mask pattern 125 overlapping with the upper groove 110A and the preliminary grooves 110B to 110D. FIG. 10A is a sectional view of the stack structure ES to be etched, which is taken along line D-D' shown in FIG. 9. FIG. 10B is a sectional view of the stack structure ES to be etched, which is taken along line E-E' shown in FIG. 9.

Referring to FIGS. 9, 10A, and 10B, a second mask pattern 125 may be formed on the stack structure ES to be etched. The second mask pattern 125 may include a photoresist pattern.

The second mask pattern 125 may include second openings OP2 spaced apart from each other. The second openings OP2 may be formed on the third stack structure ST3 to respectively open the reference regions R1 to R4. The upper groove 110 may be protected by the second mask pattern 125. The second mask pattern 125 may block portions of the third stack structure ST3, which are disposed at the periphery of the reference regions R1 to R4.

FIG. 11 is a sectional view illustrating a process of forming a plurality of grooves 130A to 130D.

Referring to FIG. 11, grooves 130A to 130D spaced apart from each other may be simultaneously formed by alternately repeating an etching process of the stack structure ES to be etched, performed by using the second mask pattern 125 as an etch barrier, and a trimming process of the second mask pattern 125. The etching process using the second mask pattern 125 as the etch barrier may be started from the reference regions R1 to R4 disposed at different levels as shown in FIGS. 10A and 10B. Accordingly, the grooves 130A to 130D may be simultaneously formed in different depths in the stack structure ES to be etched.

The grooves 130A to 130D may be formed to respectively open upper surfaces of the lower layers LL1 to LL4. In other words, each of the grooves 130A to 130D may be formed to have a bottom surface being coplanar with a lower layer corresponding thereto. Each of the grooves 130A to 130D may include a first step structure SW1 and a second step structure SW2, which are formed along sidewalls facing each other. Each of the first step structure SW1 and the second step structure SW2 may include a plurality of steps 131a to 131i. A height from a bottom to a top of each of the first step structure SW1 and the second step structure SW2 may be formed greater than that of each of the upper steps of the upper groove 110A shown in FIG. 6A. The steps 131a to 131i may be substantially formed to have the same height.

In an embodiment, each of the steps 131a to 131i may include two or more layers consecutively disposed among the lower layers LL1 to LL4, the intermediate layers ML1 to ML32, and the upper layers UL1 to UL4. A stacked number of the layers included in each of the steps 131a to 131i may be equal to that of the lower layers LL1 to LL4 constituting the first stack structure ST1. For example, the first stack structure ST1 may include first to fourth lower layers LL1 to LL4, and each of the steps 131a to 131i may include four layers consecutively disposed among the lower layers LL1 to LL4, the intermediate layers ML1 to ML32, and the upper layers UL1 to UL4.

In accordance with an embodiment, different groups of the steps 131a to 131i disposed in different grooves 130A to 130D may be disposed at different levels.

An etching process may be performed to etch two or more layers among the lower layers LL1 to LL4, the intermediate layers ML1 to ML32, and the upper layers UL1 to UL4 by using the second mask pattern 125 as an etch barrier. A trimming process may be performed after the etching process. The etching process may be repeated whenever two or more layers among the intermediate layers ML1 to ML32 are exposed through the trimming process.

The trimming process is a process of removing a portion of the second mask pattern 125 such that the area of each of the second openings OP2 shown in FIG. 2 is expanded. The trimming process may be performed whenever the etching process of the stack structure ES to be etched is repeated. Whenever the trimming process is repeated, the width of each of the second openings OP2 may be expanded in the order of ⓐ, ⓑ, ⓒ, ⓓ, ⓔ, ⓕ, ⓖ, ⓗ, and ⓘ. Whenever the width of each of the second openings OP2 increases, the intermediate layers ML1 to ML32 may be sequentially exposed. When the trimming process is repeated, two or more layers among the lower layers LL1 to LL4, the intermediate layers ML1 to ML32, and the upper layers UL1 to UL4 may be re-etched.

The etching process and the trimming process may be repeated whenever each of the lower layers LL1 to LL4 is exposed. The etching for forming the grooves 130A to 130D may be controlled such that portions of the third stack structure ST3 can remain at the periphery of the grooves 130A to 130D.

In accordance with the above-described embodiments, the number of mask processes performed to expose each of the lower layers LL1 to LL4, the intermediate layers ML1 to ML32, and the upper layers UL1 to UL4 of the stack structure ES to be etched can be decreased. Further, the number of trimming processes can be decreased.

FIG. 12 is a plan view illustrating a step of forming an upper slit 141 and slits 143.

Referring to FIG. 12, an upper slit 141 penetrating the upper groove 110A may be formed by etching the third stack structure ST3 shown in FIG. 11. The upper groove 110A may be filled with an insulating layer. Subsequently, slits 143 penetrating the stack structure ES to be etched may be formed by etching the first to third stack structures ST1 to ST3. The slits 143 may be disposed with the upper slit 141 interposed therebetween. In an embodiment, the slits 143 may be a path through which sacrificial layers of the stack structure ES to be etched, which is shown in FIG. 11, are replaced with a conductive layer or insulating material. Although not shown in the drawing, the process of forming the upper slit may be omitted.

The upper groove 110A may be used as the upper connection region connected to the first contact plug as described with reference to FIG. 5A. The first step structures SW1 and the second step structures SW2 respectively formed from the first reference region R1 and the second reference regions R2, which are described with reference to FIG. 8, may be used as connection regions Ra to Rd connected to second contact plugs and third contact plugs as described with reference to FIGS. 5B and 5C.

Figure 13:
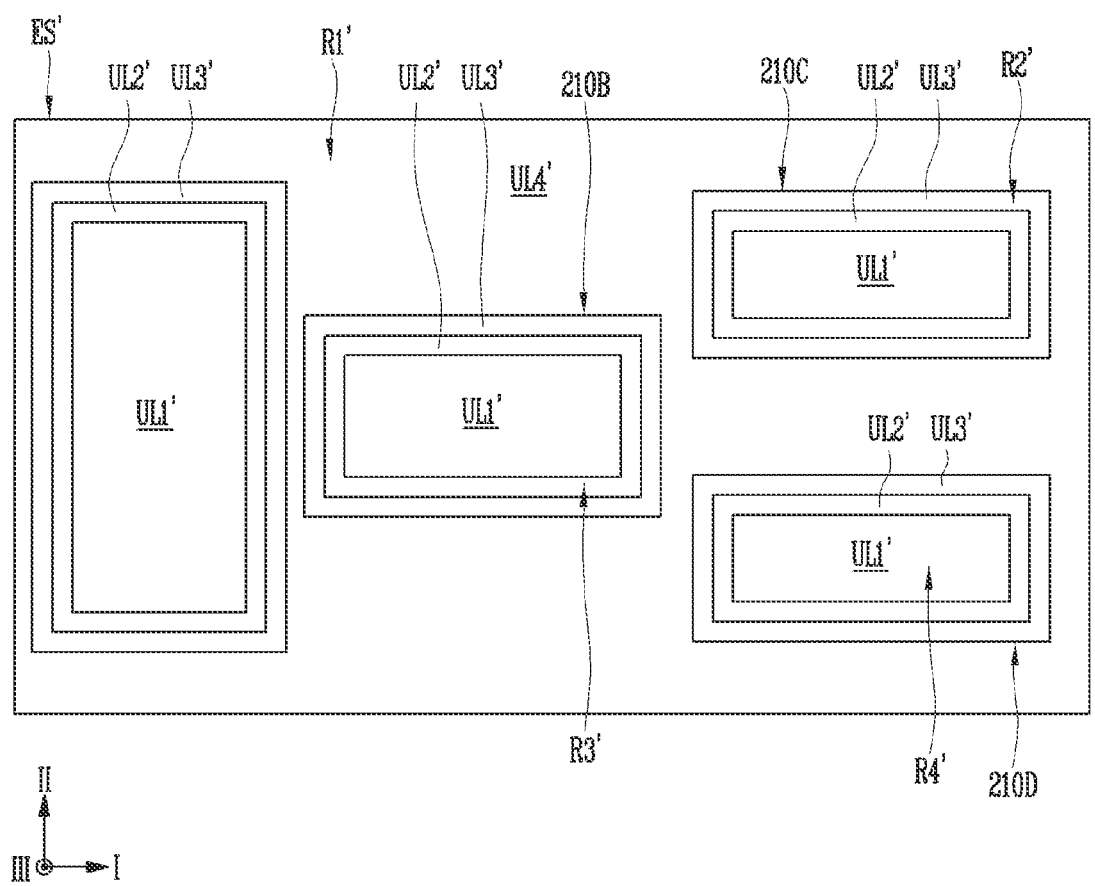
FIGS. 13 to 15 are plan views illustrating a manufacturing method of a semiconductor memory device in accordance with an embodiment of the present disclosure.
Figure 14:
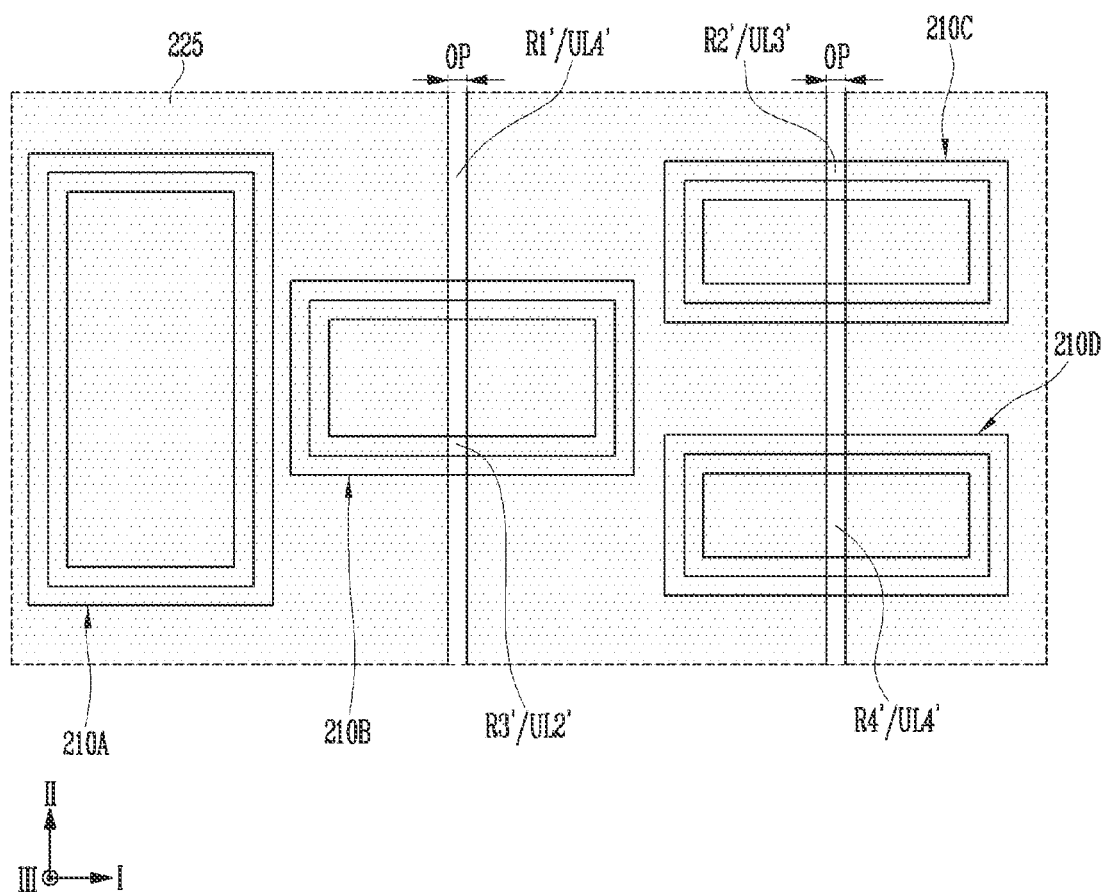
Figure 15:
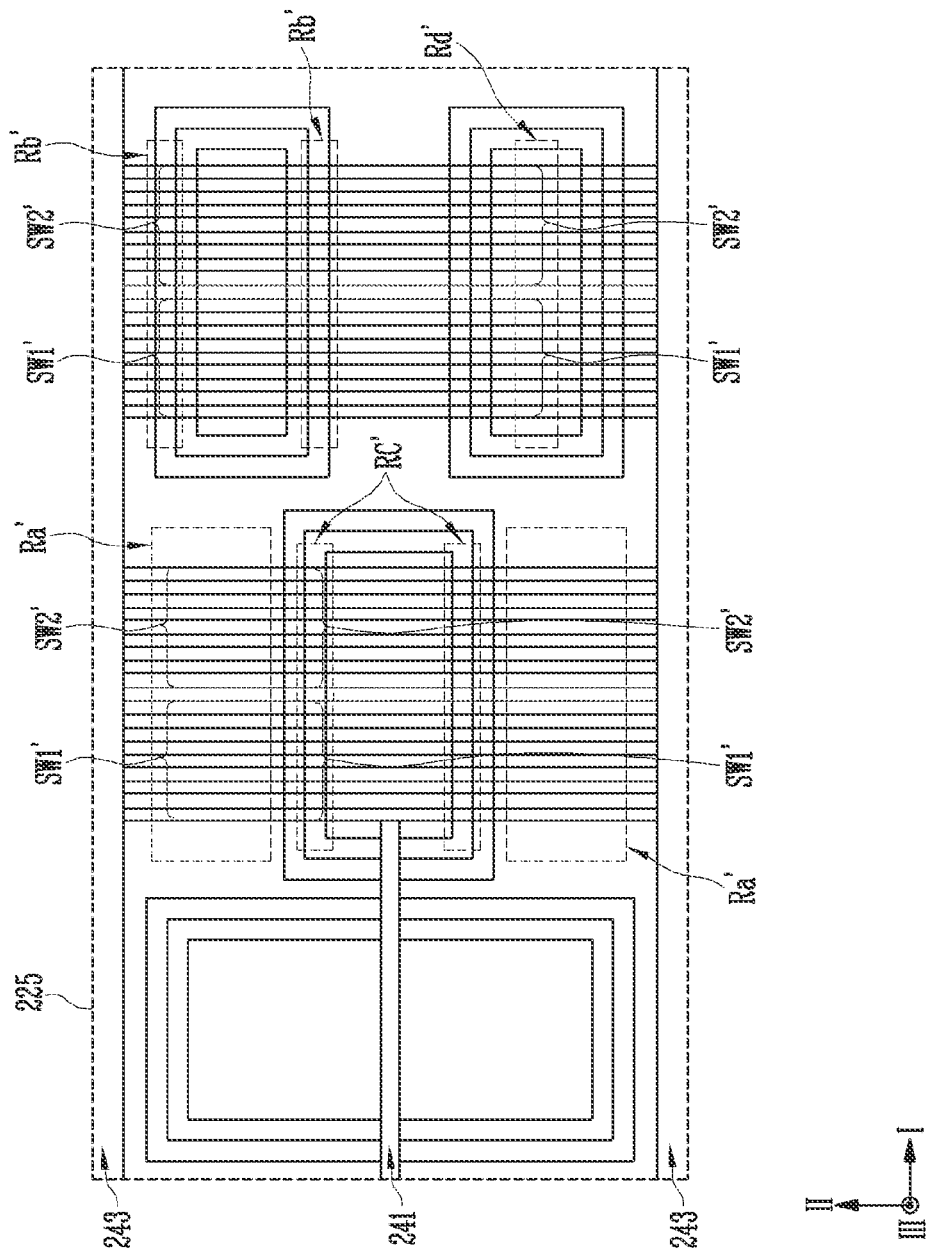

FIGS. 13 to 15 are plan views illustrating a manufacturing method of a semiconductor memory device in accordance with an embodiment of the present disclosure. The semiconductor memory device shown in FIG. 3B may be implemented using the manufacturing method which will be described later with reference to FIGS. 13 to 15.

FIG. 13 is a plan view illustrating an upper groove 210A and a plurality of preliminary grooves 210B to 210D, which are formed in a stack structure ES' to be etched.

The stack structure ES' to be etched may include first to third stack structures as described with reference to FIGS. 7A and 7B. The third stack structure may include a plurality of upper layers UL1' to UL4' stacked in a vertical direction III as described with reference to FIGS. 7A and 7B. The stack structure ES' to be etched may extend to overlap with the cell region CA and the contact region CTA of the substrate described with reference to FIG. 1. FIG. 13 illustrates a portions of the stack structure ES' to be etched, which overlaps with the contact region CTA shown in FIG. 1.

Referring to FIG. 13, the upper layers of the third stack structure may include a first upper layer UL1' disposed in the lowermost layer and two or more second upper layers UL2' to UL4' stacked in the vertical direction III on the first upper layer UL1'.

An upper groove 210A and preliminary grooves 210B to 210D may be disposed in the third stack structure to be spaced apart from each other. The preliminary grooves 210B to 210D may be spaced apart from the upper groove 210A in a first direction I. The preliminary grooves 210B to 210D may be spaced apart from each other the first direction I or be spaced apart from each other in a second direction II intersecting the first direction I.

The upper groove 210A and the preliminary grooves 210B to 210D may be formed using the processes described with reference to FIGS. 6, 7A, and 7B. On a plane extending in the first direction I and the second direction II, the arrangement of the preliminary grooves 210B to 210D may be variously modified. For example, first preliminary grooves 210C and 210D among the preliminary grooves 210B to 210D may be adjacent to each other in the second direction II, and the other preliminary groove 210B may be disposed to be spaced apart from the first preliminary grooves 210C and 210D in the first direction I.

As described above, when the preliminary grooves 210B to 210D are arranged to be spaced apart from each other in the first direction I and the second direction II, the area occupied by the contact region CTA shown in FIG. 1 can be reduced.

Each of the upper groove 210A and the preliminary grooves 210B to 210D may be formed to expose an upper surface of the first upper layer UL1' as described with reference to FIGS. 6, 7A, and 7B. A step structure may be formed along a sidewall of each of the upper groove 210A and the preliminary grooves 210B to 210D. The step structure may be defined by upper steps respectively configured with the second upper layers UL2' to UL4'. The upper steps may be formed by alternately repeating an etching process of the third stack structure, performed by using a first mask pattern as an etch barrier, and a trimming process of the first mask pattern as described with reference to FIGS. 6, 7A, and 7B. The arrangement of first openings of the first mask pattern may be changed to fit that of the upper groove 210A and the preliminary grooves 210B to 210D.

When the preliminary grooves 210B to 210D are formed, reference regions R1' to R4' respectively defined on upper surfaces of the upper layers UL1' to UL4' of the third stack structure may be exposed. The reference regions R1' to R4' may include a first reference region R1' exposing the uppermost second upper layer UL4' and second reference regions R2' to R4' respectively defined in the preliminary grooves 210B to 210D. One R4' among the second reference regions R2' to R4' may expose the first upper layer UL1, and the others may respectively expose the other second upper layers UL2' and UL3' except the uppermost second upper layer UL4' among the second upper layers UL2' to UL4'.

FIG. 14 is a plan view illustrating a second mask pattern 225 overlapping with the upper groove 210A and the preliminary grooves 210B to 210D.

Referring to FIG. 14, the second mask pattern 225 may include second openings spaced apart from each other. The second mask pattern 225 may include a photoresist pattern.

The second openings OP may be formed to open the reference regions R1' to R4'. Each of the second openings OP may extend in the second direction II. Two or more reference regions among the reference regions R1' to R4' may be opened by each of the second openings OP.

The upper groove 210A may be protected by the second mask pattern 225. The second mask pattern 225 may block portions of the third stack structure disposed at the periphery of the reference regions R1' to R4'.

An etching process of the stack structure ES' to be etched, which is shown in FIG. 13, performed by using the second mask pattern 225 shown in FIG. 14 as an etch barrier and a trimming process of the second mask pattern 225 may be alternately repeated. Accordingly, a plurality of grooves 130A to 130D shown in FIG. 11 can be simultaneously formed from the respective reference regions R1' to R4'.

FIG. 15 is a plan view illustrating a step of forming an upper slit 241 and slits 243. Also, FIG. 15 illustrates first step structures SW1' and second step structures SW2', which are defined while the above-described grooves are being formed. Sections of the first step structures SW1' and the second step structures SW2, which are formed along sidewalls of the grooves, are the same as shown in FIG. 11.

Referring to FIG. 15, an upper slit 241 penetrating the upper groove 210A and slits 243 penetrating the stack structure to be etched may be formed. The upper slit 241 and the slits 243 may be formed using the processes described with reference to FIG. 12. In another embodiment, the process of forming the upper slit 241 may be omitted.

The upper groove 210 may be used as the upper connection region connected to the first contact plug as described with reference to FIG. 5A. The first step structures SW1' and the second step structures SW2, which are formed from each of the first reference region R1' and the second reference regions R2', which are described with reference to FIG. 13 may be used as connection regions Ra' to Rd' connected to the second contact plug and the third contact plug as described with reference to FIGS. 5B and 5C.

Figure 16:
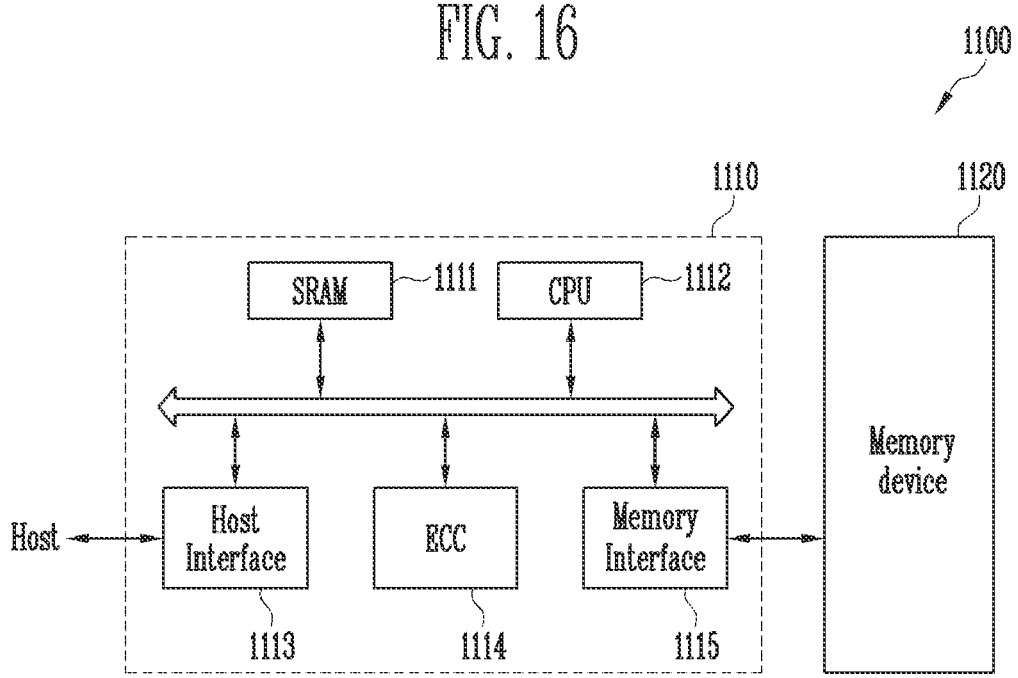
FIG. 16 is a block diagram illustrating a configuration of a memory system in accordance with an embodiment of the present disclosure.

FIG. 16 is a block diagram illustrating a configuration of a memory system 1100 in accordance with an embodiment of the present disclosure.

Referring to FIG. 16, the memory system 1100 in accordance with the embodiment of the present disclosure includes a memory device 1120 and a memory controller 1110.

The memory device 1120 may be a multi-chip package configured with a plurality of flash memory chips. The memory device 1120 may include at least one of the semiconductor memory devices described with reference to FIGS. 1, 2A and 2B, 3A and 3B, and 4A to 4C.

The memory controller 1110 may be configured to control the memory device 1120, and may include a static random access memory (SRAM) 1111, a central processing unit (CPU) 1112, a host interface 1113, an error correction circuit (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Drive (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 17:
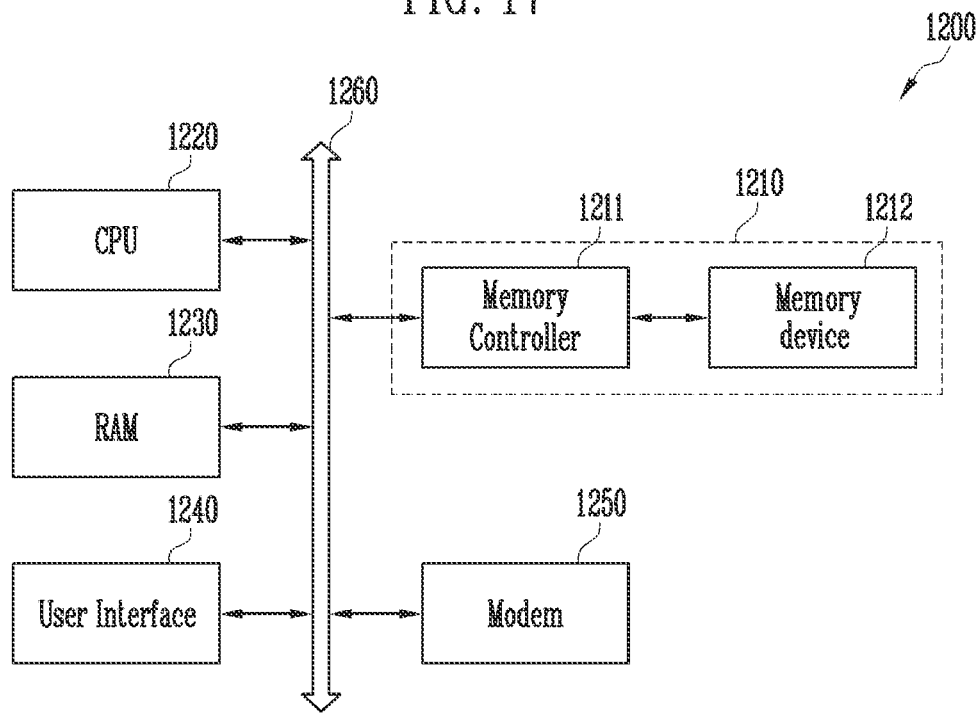
FIG. 17 is a block diagram illustrating a configuration of a computing system in accordance with an embodiment of the present disclosure.

FIG. 17 is a block diagram illustrating a configuration of a computing system 1200 in accordance with an embodiment of the present disclosure.

Referring to FIG. 17, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

In accordance with the present disclosure, connection regions of a stack structure can be exposed through a plurality of steps formed along sidewalls of grooves having different lengths.

In accordance with the present disclosure, an etching process for forming a plurality of steps from reference regions disposed at different levels may be performed, so that connection regions of a stack structure, which are disposed in different depths, can be simultaneously exposed. Accordingly, the process of forming the connection regions can be simplified.

What is claimed is:

1. A semiconductor memory device comprising:
 a lower structure having a cell region and a contact region, wherein a peripheral circuit is included in the lower structure;
 a lower stack structure on the lower structure and including a plurality of lower layers stacked in a vertical direction;
 an intermediate stack structure on the lower stack structure and including a plurality of intermediate layers stacked in the vertical direction;
 a plurality of grooves in the contact region and penetrating the intermediate stack structure, the plurality of grooves exposing the lower stack structure at different depths; and
 a plurality of steps formed along sidewalls of the plurality of grooves,
 wherein each of the plurality of steps includes two or more layers consecutively stacked among the plurality of lower layers and the plurality of intermediate layers, and
 wherein upper surfaces of the two or more layers consecutively stacked are exposed in different grooves among the plurality of grooves, respectively.

2. The semiconductor memory device of claim 1, wherein the steps form a first step structure and a second step structure along sidewalls of each of the grooves, and
wherein the first step structure and the second step structure face each other.

3. The semiconductor memory device of claim 1, further comprising a contact plug connected to at least one of the steps,
wherein the contact plug is connected to the uppermost layer among the two or more layers of the at least one of the steps.

4. The semiconductor memory device of claim 1, wherein a stacked number of the two or more layers included in each of the steps is equal to that of the lower layers.

5. The semiconductor memory device of claim 1, wherein a height of each of the steps is equal to that of the lower stack structure.

6. The semiconductor memory device of claim 1, wherein bottom surfaces of the grooves respectively open the lower layers.

7. The semiconductor memory device of claim 1, wherein a total stacked number of the plurality of intermediate layers is greater than that of the lower layers.

8. The semiconductor memory device of claim 1, wherein different groups of the steps formed in different grooves share at least one of the lower layers and the intermediate layers.

9. The semiconductor memory device of claim 8, wherein the lower layers include a first lower layer and a second lower layer, which are stacked in the vertical direction,
wherein the grooves include a first groove exposing the first lower layer and a second groove exposing the second lower layer,
wherein the steps include a plurality of first steps formed along a sidewall of the first groove and a plurality of second steps formed along a sidewall of the second groove, and
wherein first intermediate layers disposed in the uppermost layers of the first steps among the intermediate layers are included in the second steps, respectively.

10. The semiconductor memory device of claim 1, wherein some of the intermediate layers include upper surfaces opened by corresponding steps, and others of the intermediate layers include side surfaces opened by the corresponding steps.

11. The semiconductor memory device of claim 1, wherein sidewalls of the two or more layers included in each of the steps are coplanar with a sidewall of a step corresponding thereto.

12. The semiconductor memory device of claim 1, further comprising:
an upper stack structure including a first upper layer disposed on the intermediate layers and two or more second upper layers stacked in the vertical direction on the first upper layer;
an upper groove formed in the upper stack structure to open the first upper layer; and
a plurality of upper steps formed along a sidewall of the upper groove.

13. The semiconductor memory device of claim 12, wherein a height from a bottom to a top of each of the steps is greater than that of each of the upper steps.

14. The semiconductor memory device of claim 12, wherein the upper steps are configured with the second upper layers, respectively.

15. The semiconductor memory device of claim 12, wherein a total stacked number of the first upper layer and the two or more second upper layers is equal to that of the lower layers.

16. The semiconductor memory device of claim 12, wherein a total stacked number of the plurality of intermediate layers is greater than a total stacked number of the first upper layer and the two or more second upper layers.

17. The semiconductor memory device of claim 12, wherein the upper stack structure remains as a dummy structure between the grooves adjacent to each other.

18. The semiconductor memory device of claim 12, wherein each of the lower layers, the first upper layer, and the second upper layers is formed of a stacked structure including an interlayer insulating layer and an electrode.

19. The semiconductor memory device of claim 1, further comprising:
at least one of a pipe gate and a doped silicon layer in the lower structure.

20. The semiconductor memory device of claim 1, wherein the peripheral circuit includes a row decoder, a page buffer and a column decoder.

* * * * *